(12) United States Patent
Mignot et al.

(10) Patent No.: US 12,142,562 B2
(45) Date of Patent: Nov. 12, 2024

(54) SUBTRACTIVE METAL ETCH WITH IMPROVED ISOLATION FOR BEOL INTERCONNECT AND CROSS POINT

(71) Applicant: INTERNATIONAL BUSINESS MACHINES CORPORATION, Armonk, NY (US)

(72) Inventors: Yann Mignot, Slingerlands, NY (US); Chanro Park, Clifton Park, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 650 days.

(21) Appl. No.: 17/304,466

(22) Filed: Jun. 22, 2021

(65) Prior Publication Data
US 2022/0406704 A1 Dec. 22, 2022

(51) Int. Cl.
*H01L 23/528* (2006.01)
*H01L 21/768* (2006.01)
(Continued)

(52) U.S. Cl.
CPC ...... *H01L 23/528* (2013.01); *H01L 21/76802* (2013.01); *H01L 21/76831* (2013.01);
(Continued)

(58) Field of Classification Search
CPC ............. H01L 23/528; H01L 21/76802; H01L 21/76831; H01L 23/5329; H01L 21/76807;
(Continued)

(56) References Cited

U.S. PATENT DOCUMENTS

| 5,926,733 A | 7/1999 | Heo |
| 7,018,935 B2 | 3/2006 | Park |

(Continued)

FOREIGN PATENT DOCUMENTS

| TW | 201349307 A | 12/2013 |
| TW | 201806126 A | 2/2018 |

(Continued)

OTHER PUBLICATIONS

Notification of Transmittal of the International Search Report and the Written Opinion of the International Searching Authority, or the Declaration, Date of mailing Sep. 28, 2022, International application No. PCT/EP2022/063663, 12 pages.

*Primary Examiner* — Patricia D Valenzuela
(74) *Attorney, Agent, or Firm* — Yuanmin Cai

(57) ABSTRACT

A top cap layer covering a first metal line and a second metal line, horizontally between the first metal line and the second metal line is, in sequential order, a post cap liner, an air gap and the post cap liner. A first set of metal lines embedded in an upper surface of a dielectric, a second set of metal lines embedded below the dielectric and above the electronic components, a post cap liner covering the first set of metal lines, a cavity which dissects a first metal line of the first set of metal lines and extends to a second metal line of the second set of metal lines and dissects the second set of metal lines. Forming a cavity in a first metal line embedded in an upper surface of a dielectric, where the first metal line and the dielectric are covered by a top cap layer.

18 Claims, 20 Drawing Sheets

Section A-A

(51) Int. Cl.
*H01L 23/532* (2006.01)
*H01L 21/033* (2006.01)

(52) U.S. Cl.
CPC ...... *H01L 23/5329* (2013.01); *H01L 21/0337* (2013.01); *H01L 21/7682* (2013.01)

(58) Field of Classification Search
CPC ........... H01L 21/7682; H01L 21/76832; H01L 21/76834; H01L 21/76892; H01L 21/76883; H01L 21/0337
See application file for complete search history.

(56) References Cited

U.S. PATENT DOCUMENTS

| | | | |
|---|---|---|---|
| 7,517,799 B2 | 4/2009 | Lee | |
| 7,678,658 B2 | 3/2010 | Yang | |
| 8,357,609 B2 | 1/2013 | Ryan | |
| 9,508,642 B2 | 11/2016 | Bouche | |
| 9,711,447 B1 | 7/2017 | Shu | |
| 9,905,424 B1 | 2/2018 | Law | |
| 10,134,580 B1 | 11/2018 | Licausi | |
| 10,319,626 B1 | 6/2019 | Tang | |
| 10,459,338 B2 | 10/2019 | Nyhus | |
| 10,825,720 B2 | 11/2020 | Mignot | |
| 10,825,726 B2 | 11/2020 | Chen | |
| 10,886,176 B2 | 1/2021 | Kikuchi | |
| 2009/0309230 A1* | 12/2009 | Cui | H01L 23/53238 257/773 |
| 2010/0206842 A1 | 8/2010 | Gu | |
| 2014/0252625 A1* | 9/2014 | Ting | H01L 23/5226 257/751 |
| 2017/0033200 A1 | 2/2017 | Leobandung | |
| 2017/0243784 A1 | 8/2017 | Chi | |
| 2017/0352585 A1 | 12/2017 | Burns | |
| 2019/0318989 A1 | 10/2019 | Shao | |
| 2020/0083349 A1 | 3/2020 | Bao | |
| 2020/0126842 A1 | 4/2020 | Topaloglu | |
| 2020/0402849 A1 | 12/2020 | Briggs | |

FOREIGN PATENT DOCUMENTS

| | | |
|---|---|---|
| TW | 201810591 A | 3/2018 |
| TW | 202109680 A | 3/2021 |
| WO | 2013095396 A1 | 6/2013 |
| WO | 2017111868 W | 6/2017 |
| WO | 2022268417 A1 | 12/2022 |

* cited by examiner

Section B-B

Section A-A

Section A-A

Section A-A

Section B-B

Section A-A

*Section A-A*

*Section A-A*

*Section A-A*

*Section A-A*

Section B-B

Section A-A

Section A-A

Section A-A

Section B-B

Section A-A

*Section A-A*

*Section A-A*

*Section A-A*

*Section A-A*

*Section A-A*

Section A-A

Section A-A

Section A-A

Section A-A

Section A-A

Section A-A

Section A-A

Section A-A

Section A-A

SUBTRACTIVE METAL ETCH WITH IMPROVED ISOLATION FOR BEOL INTERCONNECT AND CROSS POINT

BACKGROUND

The present invention relates to integrated circuits, and more specifically, to interconnect layers of electrical connections.

Semiconductor wafers, chips, devices, and related devices, rely on a plurality of metallization layers or metal lines stacked on top of one another on a semiconductor substrate which provides electronic interconnections between integrated circuits on the semiconductor substrate or layer. A metallization layer may also be referred to as a back-end-of-line (BEOL) metallization layer which could be disposed on a semiconductor material stack. Semiconductor contacts in a top layer in the semiconductor material stack are electrically connected to metal contacts and metal interconnects in a metallization layer disposed on the semiconductor material stack.

The interconnect layers may be connected to devices on the integrated circuit by vias. The vias are often etched through layers of the integrated circuit and filled with a conductive material. In general, the metal lines (also referred to as wiring lines) provide electrical connections within the same metal level, and the conductive vias provide inter-level or vertical connections between different (metal) line levels. Interconnect structures (i.e., metal lines and vias) are typically formed using single-damascene (SD) or dual-damascene (DD) fabrication processes. In the single-damascene process, interconnect structures are manufactured independently, while in the dual-damascene process are manufactured at the same time.

SUMMARY

According to an embodiment of the present invention, a semiconductor structure is provided. The semiconductor structure including a first metal line embedded in an upper surface of a dielectric, where the dielectric is a layer above electronic components of the semiconductor structure, a top cap layer covering the first metal line and covering a portion of the dielectric not covered by the first metal line, a second metal line embedded in the upper surface of the dielectric, aligned with the first metal line, where horizontally between the first metal line and the second metal line is, in sequential order, a post cap liner, an air gap and the post cap liner.

According to an embodiment of the present invention, a semiconductor structure is provided. The semiconductor structure including a first metal line embedded in an upper surface of a dielectric, wherein the dielectric is a layer above electronic components of the semiconductor structure, a second metal line embedded in the upper surface of the dielectric, aligned with the first metal line, where between the first metal line and the second metal line is a post cap liner, a top cap layer above a portion of the dielectric not covered by the first metal line nor the second metal line, the top cap layer covering the first metal line, the top cap layer above the second metal line and the post cap liner is above the top cap layer.

According to an embodiment of the present invention, a semiconductor structure is provided. The semiconductor structure including a first set of metal lines embedded in an upper surface of a dielectric, where the dielectric is a layer above electronic components of the semiconductor structure, a second set of metal lines embedded below the dielectric and above the electronic components, a post cap liner covering the first set of metal lines, and covering a portion of the dielectric not covered by the first set of metal lines, a cavity which dissects a first metal line of the first set of metal lines and extends to a second metal line of the second set of metal lines and dissects the second set of metal lines.

According to an embodiment of the present invention, a method is provided. The method including forming a cavity in a first metal line embedded in an upper surface of a dielectric, where the dielectric is a layer above electronic components of the semiconductor device, where the first metal line and the dielectric are covered by a top cap layer.

According to an embodiment of the present invention, a method is provided. The method including forming a cavity across a first metal line and a second metal line, both the first metal line and the second metal line embedded in an upper surface of a dielectric, where the dielectric is a layer above electronic components of the semiconductor device wherein the first metal line and the second metal line are parallel to each other and are separated by the dielectric, where the first metal line, the second metal line and the dielectric are covered by a top cap layer.

According to an embodiment of the present invention, a method is provided. The method including forming a cavity across a first metal line and a second metal line, the first metal line embedded in an upper surface of a dielectric, where the dielectric is a layer above electronic components of the semiconductor device, where the second metal line is below the dielectric, where the first metal line and the second metal line are perpendicular to each other and are separated by the dielectric, where the first metal line and the dielectric are covered by a top cap layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
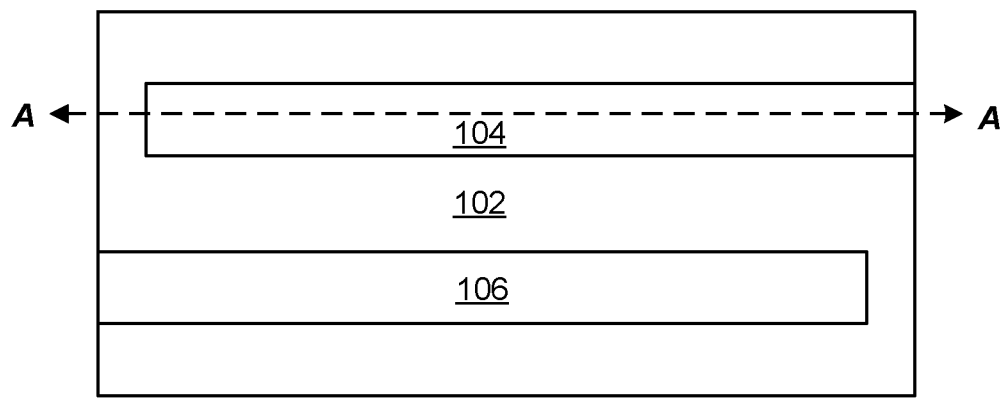
FIGS. 1 and 2 illustrate a cross-sectional top view and a cross sectional side view, of a semiconductor structure at an intermediate stage of fabrication, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Embodiments of the present invention relate to integrated circuits, and more specifically, to interconnect layers of electrical connections. The following described exemplary embodiments provide a system, method, and program product to, among other things, provide subtractive metallization by removing select portions of metal lines after metallization.

Therefore, the present embodiment has the capacity to improve the technical field of integrated circuits by providing a footprint reduction, improved isolation between elements and less constraint on optical proximity correction (OPC) mask used to form lines and vias.

As previously described, semiconductor wafers, chips, devices, and related devices, rely on a plurality of metallization layers or metal lines stacked on top of one another on a semiconductor substrate which provides electronic interconnections between integrated circuits on the semiconductor substrate or layer. A metallization layer may also be referred to as a back-end-of-line (BEOL) metallization layer which could be disposed on a semiconductor material stack. Semiconductor contacts in a top layer in the semiconductor material stack are electrically connected to metal contacts and metal interconnects in a metallization layer disposed on the semiconductor material stack. The interconnects may be connected vertically to other interconnects or to devices on the integrated circuit using vias. The conductive lines are often formed from metallic materials such as, for example, copper, silver, aluminum, tungsten, molybdenum, ruthenium, or an alloy such as copper tungsten. Prior to depositing the metallic material, a liner layer may be deposited in a channel that defines the line. A cap liner may also be deposited over the metallic material following the formation of the line. The cap liner layer is often used to reduce metal migration into the dielectric or discourage oxidation on the metallic material.

Traditional patterning techniques such as lithography etch (LE), self-aligned double patterning (SADP), self-aligned litho-etch-litho-etch (SALELE), self aligned block (SAB) for BEOL metallization such as copper single-damascene or dual-damascene and novel subtractive metallization are dependent upon block lithographic patterning to separate lines and vias, in order to enable minimal distance between lines, both tip to tip (T2T) and tip to side (T2S), and via edge to edge (E2E). Using traditional patterning techniques, overall distances between elements cannot be reduced beyond lithographic patterning limits without jeopardizing the final product performance due to the mask design and patterning process.

Subtractive metallization is a process to remove portions of a metal layer after deposition to form some part of the BEOL interconnect. Subtractive metallization is different than single damascene (SD) and dual damascene (DD), which utilizes a process where metallization is deposited in a pre-formed interconnected patterning.

As such, it may be advantageous to strategically remove portions of metallized lines and vias to improve areas such that the T2T, T2S and via E2E can each be reduced to smaller dimensions and spacing and have an improved isolation by addition of a better dielectric film formed in areas of isolation between metal lines and vias.

According to an embodiment, metal lines and vias may be cut with portions removed after formation of metallization in a semiconductor device. Trenches and openings may be formed prior to metallization in a BEOL dielectric, by SD or DD. The metal lines and vias may be subject to a chemical mechanical polishing (CMP) technique and a top cap layer formed above the dielectric, the metal lines and the vias. Patterning of the semiconductor device may be done with an organic planarization layer, a hard mask layer and a masking layer. Resulting cavities may remove portions of the metal lines and the vias. The cavities may extend across one or more lines and/or one or more vias. The cavities may be formed in an array of lines running in more than one direction. The cavities may be formed through multiple levels of metal lines. Each cavity may be filled with one or more materials in one or more steps. Each cavity may have a liner formed prior to filling the cavity. The cavities may be filled with one or more dielectrics, the cavities may be filled with a post cap liner material, the cavities may be lined with a post cap liner and then filled with a dielectric. The cavities may be lined with a post cap liner and then a dielectric on the semiconductor device may partially fill the cavities leaving an air gap in the cavities.

The following described exemplary embodiments provide a method and structure to cut a BEOL metal line and via in a semiconductor device after metal deposition and CMP, where formation includes forming the trenches and via openings, metal deposition and performing a chemical mechanical polishing (CMP) technique on the metal lines and vias on the semiconductor device.

Figure 2:
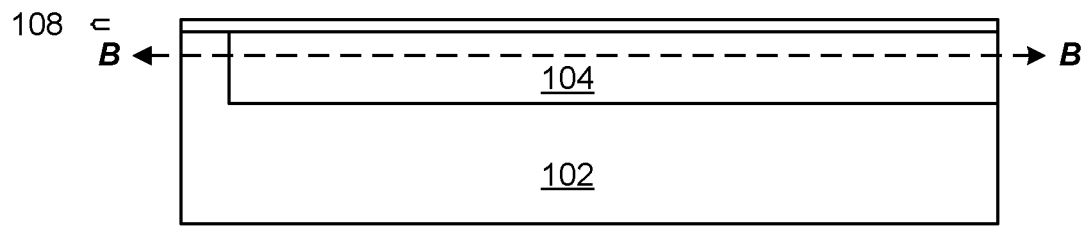

Referring now to FIGS. 1 and 2, a semiconductor structure 100 (hereinafter "structure") at an intermediate stage of fabrication is shown according to an exemplary embodiment. FIG. 1 is a cross-sectional top view of the structure 100 along section B-B and FIG. 2 is a cross-sectional side view of the structure 100 along section A-A. FIG. 2 is perpendicular to FIG. 1.

The structure 100 may include several back end of line ("BEOL") layers below what is shown in FIGS. 1 and 2. In general, the back end of line (BEOL) is the second portion of integrated circuit fabrication where the individual devices (transistors, capacitors, resistors, etc.) are interconnected with wiring on the wafer. As shown in FIGS. 1 and 2, the structure 100 includes a first dielectric 102, a metal line 104, a metal line 106 and a first top cap layer 108.

The first dielectric 102 may be formed by conformally depositing or growing a dielectric. The first dielectric 102 may be formed by deposition via a process that grows, coats, or otherwise transfers a material onto the wafer. The first dielectric 102 may be deposited by physical vapor deposition (PVD), chemical vapor deposition (CVD), electrochemical deposition (ECD), molecular beam epitaxy (MBE), and atomic layer deposition (ALD), among others. The first dielectric 102 may include one or more layers. The first dielectric 102 may be composed of, for example, silicon oxide (SiOx), silicon nitride (SiNx), silicon boron carbonitride (SiBCN), NBLoK, a low-k dielectric material (with k<4.0), including but not limited to, silicon oxide, spin-on-glass, a flowable oxide, a high density plasma oxide, borophosphosilicate glass (BPSG), or any combination thereof or any other suitable dielectric material.

Trenches (not shown) may be formed in the first dielectric 102 by, for example, reactive ion etching (RIE), for subsequent filling to form, the metal lines 104, 106. The metal lines 104, 106 can include, for example, a conductive etchable metal such as, aluminum (Al), tungsten (W), ruthenium (Ru), molybdenum (Mo) tantalum (Ta), titanium (Ti), silver (Ag), phase-change memory (PCM) materials such as germanium-antimony-tellurium (GST), MRAM metal stack or a combination of materials. The metal lines 104, 106 can be formed by for example, physical vapor deposition (PVD), an electroplate fill process, or other method. The metal lines 104, 106 are embedded in the first dielectric 102.

A chemical mechanical polishing (CMP) technique may be used to remove excess material and polish upper surfaces of the structure 100, providing a uniform horizontal surface.

The first dielectric 102 and the metal lines 104, 106 may be covered with a first top cap layer 108 that may include for example, a nitride or oxide material such as silicon nitride ($Si_xN_x$), silicon carbon nitride (SiCN), silicon oxynitride (SiON), aluminum oxide (AlO), silicon oxide ($SiO_x$), an insulator material or any other suitable material. The first top cap layer 108 may be used to avoid metallic migration into the first dielectric 102, or into other components of the structure 100, and to reduce or discourage oxidation on the metallic material.

Figure 3:
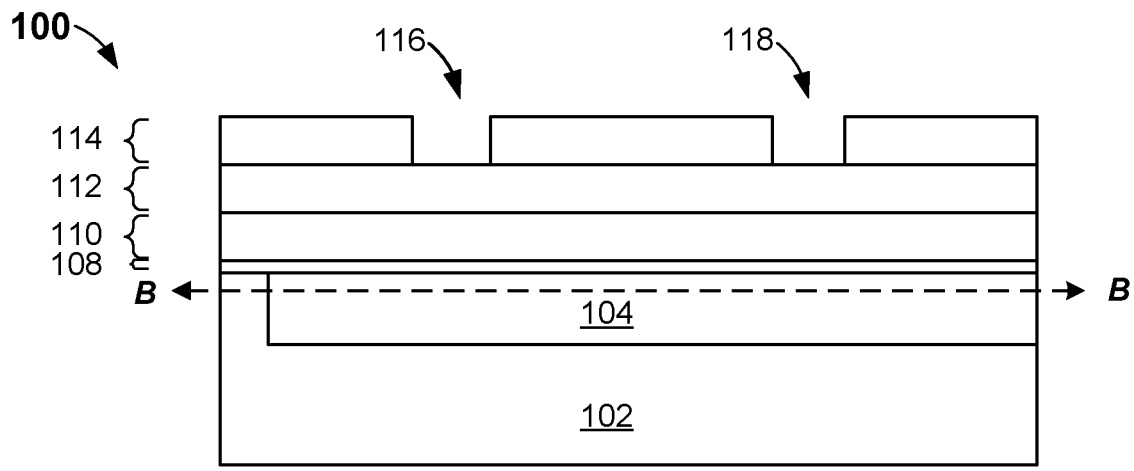
FIG. 3 illustrates a cross sectional side view of formation of an organic planarization layer material (OPL), a hard mask and a masking layer, according to an exemplary embodiment.

Referring now to FIG. 3, the structure 100 is shown according to an exemplary embodiment. FIG. 3 is a cross-sectional side view of the structure 100 along section A-A. As shown in FIG. 3, a first organic planarization layer (hereinafter "OPL") 110, a first hard mask 112 and a first masking layer 114 may be formed, according to an exemplary embodiment;

The first OPL 110 may be formed on the first top cap layer 108 by a blanket deposition using typical deposition techniques, for example spin-on coating. The first OPL 110 can be a self-planarizing organic material that includes carbon, hydrogen, oxygen, and optionally nitrogen, fluorine, and silicon. The first OPL 110 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

The first hard mask 112, may be formed on the structure 100. The first hard mask 12 may be a blanket patterning layer on the first OPL 110. The first hard mask 112 may include a low temperature oxide layer (LTO) or a silicon containing anti-reflective coating (SiARC).

The first masking layer 114 may be formed on the structure 100 on the first hard mask 112. The first masking layer 114 may include a photoresist layer patterned by known techniques using optical or EUV lithographic patterning to remove portions of the first masking layer 114 after resist develop, resulting in cavity 116 and cavity 118.

Figure 4:
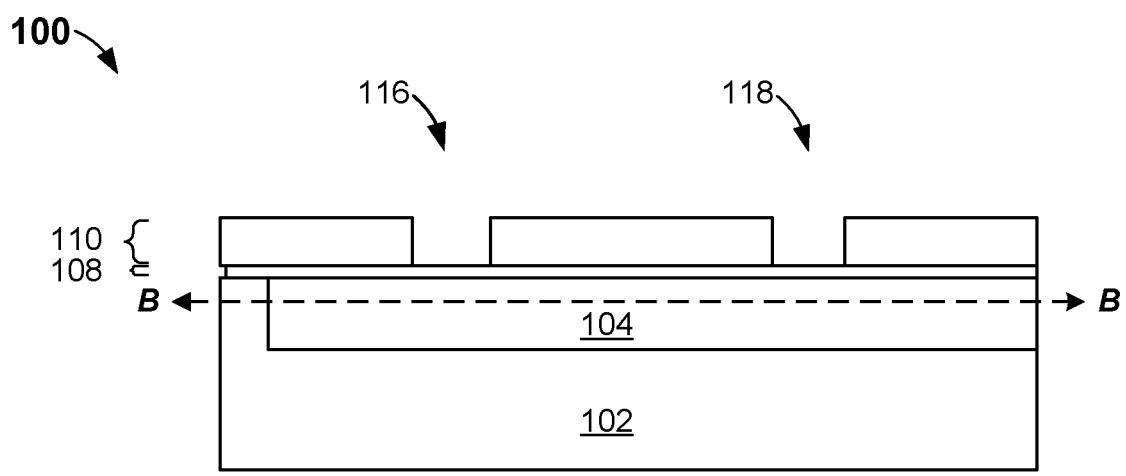
FIG. 4 illustrates a cross sectional side view of selective removal of portions of the OPL may be removed, and the hard mask and the masking layer may be removed, according to an exemplary embodiment.

Referring now to FIG. 4, the structure 100 is shown according to an exemplary embodiment. FIG. 4 is a cross-sectional side view of the structure 100 along section A-A. As shown in FIG. 4, portions of the first OPL 110 may be removed and the first masking layer 114 and the first hard mask 112 and may be removed.

Portions of the first hard mask 112 and portions of the first OPL 110 may each be selectively removed in locations of the cavities 116, 118, increasing a depth of the cavities 116, 118, and may be removed in one or more steps, exposing an upper surface of the first top cap layer 108. The portions of the first hard mask 112 and portions of the first OPL 110 may be removed by, for example, dry etch, selective to the first masking layer 114. Remaining portions of the first hard mask 112, and portions of the first OPL 110 may be removed selective to the first hard mask 112 while removing the first masking layer 114 at the same time.

Figure 5:
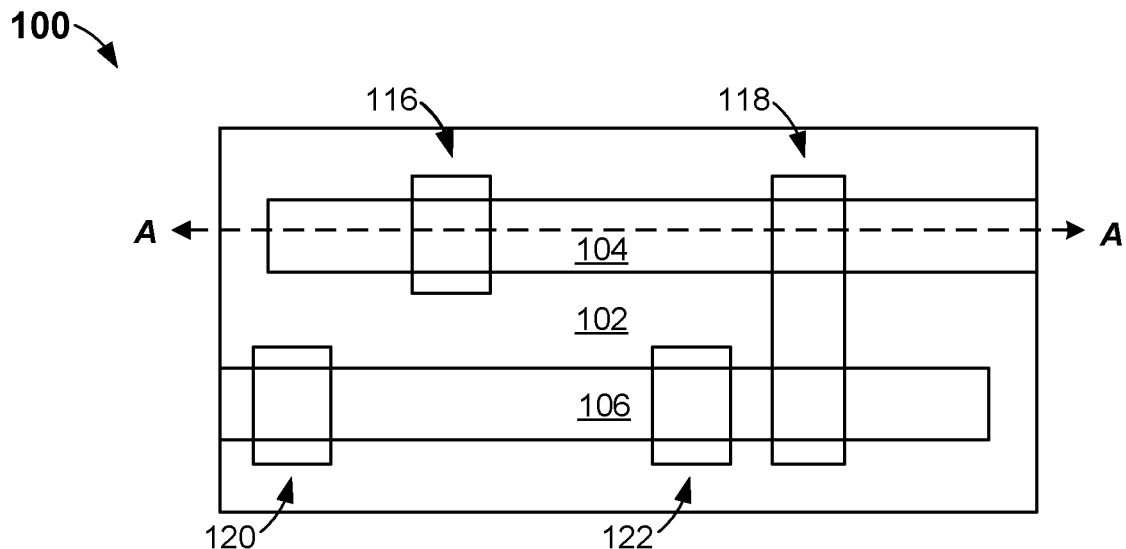
FIGS. 5 and 6 illustrate a cross-sectional top view and a cross sectional side view, respectively, of forming cavities, according to an exemplary embodiment.
Figure 6:
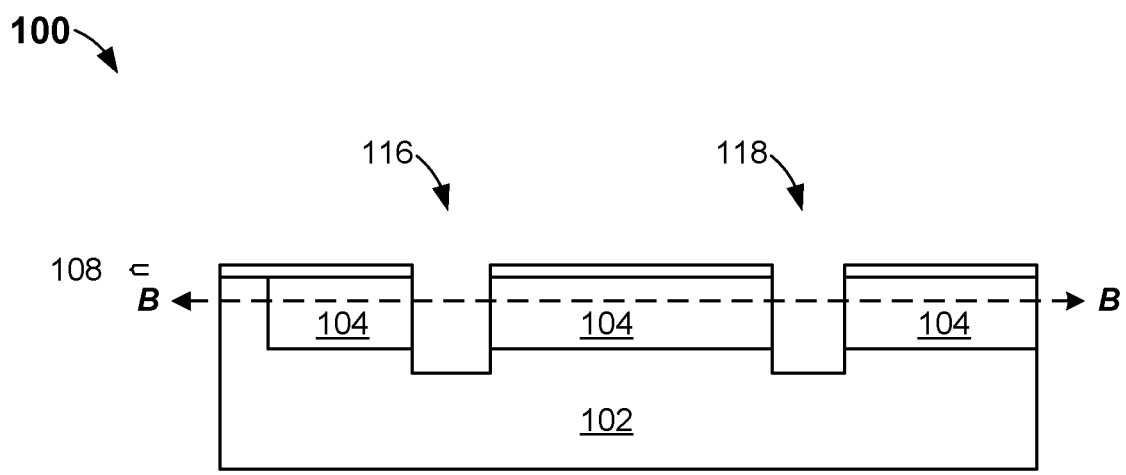

Referring now to FIGS. 5 and 6, the structure 100 is shown according to an exemplary embodiment. FIG. 5 is a cross-sectional top view of the structure 100 along section B-B and FIG. 6 is a cross-sectional side view of the structure 100 along section A-A. FIG. 6 is perpendicular to FIG. 5. As shown in FIGS. 5 and 6, portions of the metal line 104, portions of the first dielectric 102 and portions of the first top cap layer 108 may be removed. The first OPL 110 may be removed.

The portions of the first top cap layer 108, the portions of the metal line 104 and the portions of the first dielectric 102 may be removed aligned with the cavities 116, 118, increasing a depth of the cavities 116, 118 in the metal line 104, using, for example, reactive ion etching (ME). The first dielectric 102 may be partially removed aligned with the cavities 116, 118, where a lower horizontal surface of the cavities 116, 118 includes the first dielectric 102. A vertical side surface of the cavities 116, 118 includes a full vertical height or thickness of the metal line 104 and measured from a substrate below, and partial erosion of the dielectric 102.

The first OPL 110 may be selectively removed using known techniques and may be removed in one or more steps, using, for example, a dry etch. The first OPL 110 may be removed either separately or concurrently with removal of the portions of the first top cap layer 108, the portions of the metal line 104 and the portions of the first dielectric 102. The metal line 104 may be removed by dry etch or RIE using highly selectivity gas selective to the first OPL 110, the first dielectric layer and the first top cap layer 108, using for example chlorine chemistries ($Cl_2$, $BLC_3$, . . . ) and oxygen ($O_2$) plus additive gases such as $N_2$, Ar, $CH_4$ and $H_2$ to help for the plasma directionality (iso or anisotropic) and polymers control.

As shown in FIG. 5, there may be additional cavities formed, including cavity 120 and cavity 122. The cavities 120, 122 are formed using a similar method as described above, and may be formed concurrently as the cavities 116, 118. The cavities 120, 122 and the cavity 118 may be formed in portions of the metal line 106. The cavity 118 formed across more than one metal line, and as shown in FIG. 5, is formed across the metal line 104 and across the metal line 106. Any combination of cavities may be formed in the structure 100 and may extend across one or more metal lines. The cavities formed may each form a cut in a metal line, forming a break in conductively of portions of the applicable metal line. A recess into the dielectric layer 102 may be less than 5 nm as the main etch chemistry to remove the portions of the metal layers 104 and 106 are highly selectivity to the first top cap layer 108 and the first dielectric 102.

Figure 7:
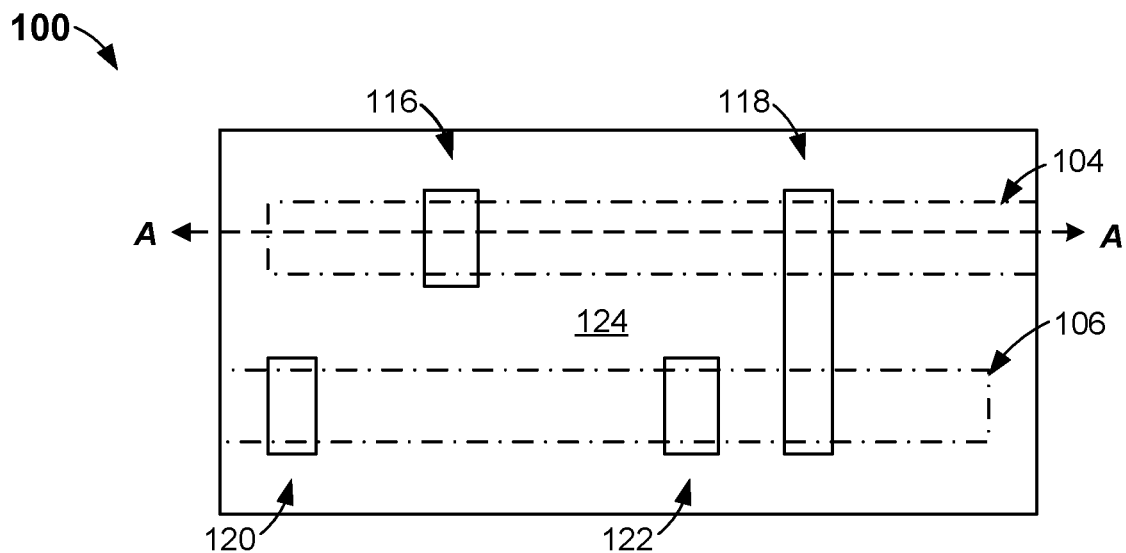
FIGS. 7 and 8 illustrate a top view and a cross sectional side view, respectively, of formation of a post cap liner, according to an exemplary embodiment.
Figure 8:
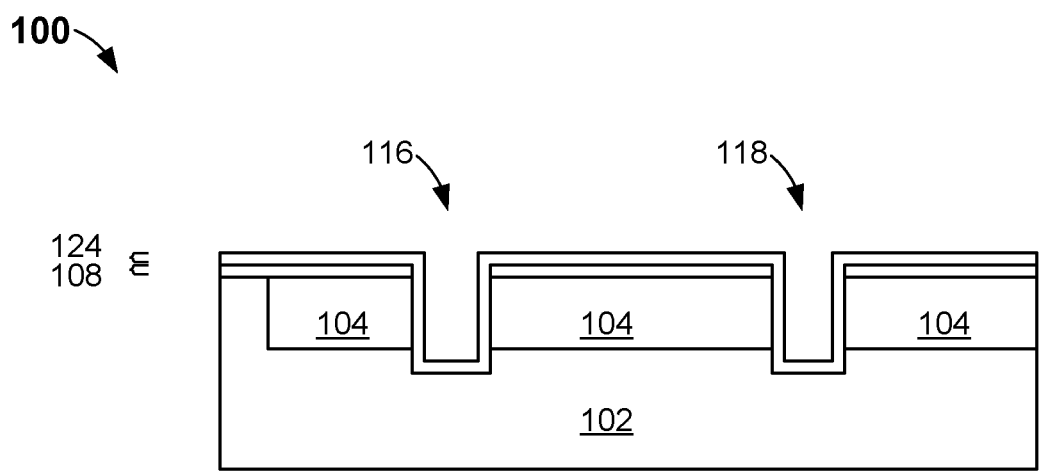

Referring now to FIGS. 7 and 8, the structure 100 is shown according to an exemplary embodiment. FIG. 7 is a top view of the structure 100 and FIG. 8 is a cross-sectional side view of the structure 100 along section A-A. FIG. 8 is perpendicular to FIG. 7. As shown in FIGS. 7 and 8, a first post cap liner 124 may be formed.

The first post cap liner 124 may be conformally formed on the structure 100. The first post cap liner 124 may provide a liner on vertical side surfaces and horizontal lower surfaces of the cavities 116, 118, 120, 122, making each of the cavities 116, 118, 120, 122 slightly smaller. The first post cap liner 124 may cover an upper horizontal surface of the first top cap layer 108 and a vertical side surfaces of the first dielectric 102 along each of the cavities 116, 118, 120, 122.

The first post cap liner 124 can include, for example, an Nblock material, aluminum oxide (AlOx), a nitride or oxide material such as silicon nitride (SixNx), silicon carbon nitride (SiCN), silicon oxynitride (SiON), or silicon oxide (SiOx) or any other suitable material including an insulator material. The first post cap liner 124 can be formed by for example, atomic layer deposition (ALD) or other suitable method.

The first post cap liner 124 may have a similar function as an NBLOCK or AlOx, to avoid metallic migration into the first dielectric 102, or into other components of the structure 100, and to reduce or discourage oxidation on the metallic material.

Figure 9:
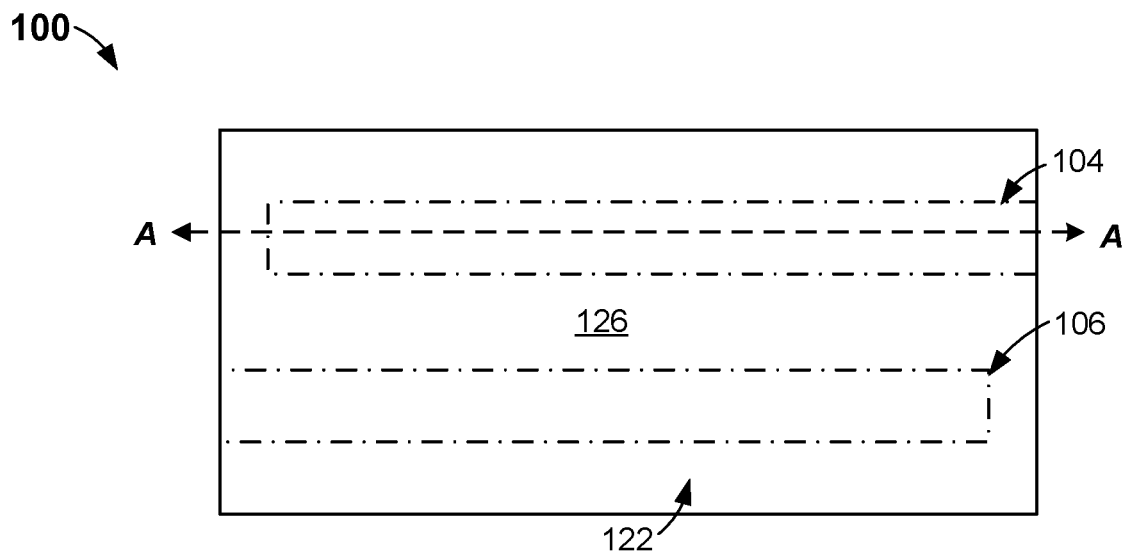
FIGS. 9 and 10 illustrate a top view and a cross sectional side view, respectively, of formation of a dielectric, according to an exemplary embodiment.
Figure 10:
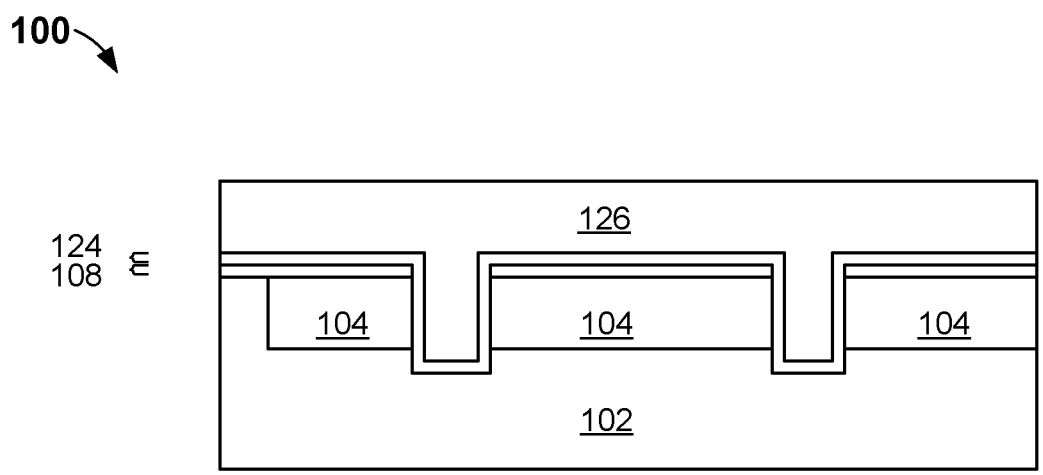

Referring now to FIGS. 9 and 10, the structure 100 is shown according to an exemplary embodiment. FIG. 9 is a top view of the structure 100 and FIG. 10 is a cross-sectional side view of the structure 100 along section A-A. FIG. 10 is perpendicular to FIG. 9. As shown in FIGS. 9 and 10, a second dielectric 126 may be formed.

The second dielectric 126 may be formed as described above in regards to the first dielectric 102. The second dielectric 126 may be the same or a different material as the first dielectric 102. The second dielectric 126 may fill the cavities 116, 118, 120, 122.

A chemical mechanical polishing (CMP) technique may be used to remove excess material and polish upper surfaces of the structure 100, providing a uniform horizontal surface.

In this embodiment, after fabrication and CMP process into a pre-formed structure, the metal lines 104, 106 each have portions removed, cutting each of the metal lines 104, 106, providing isolation between devices which are connected to each of the remaining portions of the metal lines 104, 106.

Figure 11:
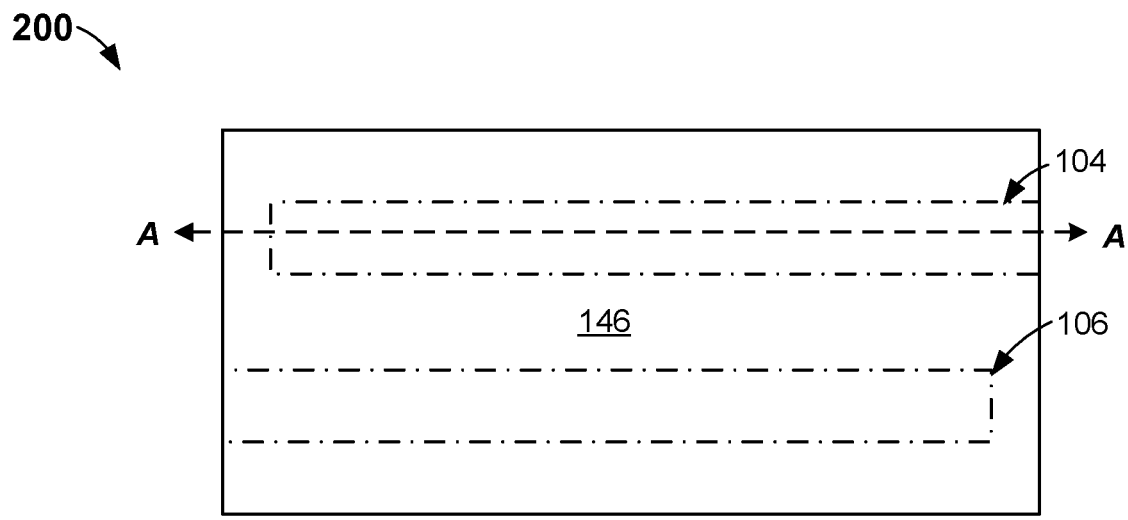
FIGS. 11 and 12 illustrate a top view and a cross sectional side view, respectively, of formation of a post cap liner fill, according to an exemplary embodiment.
Figure 12:
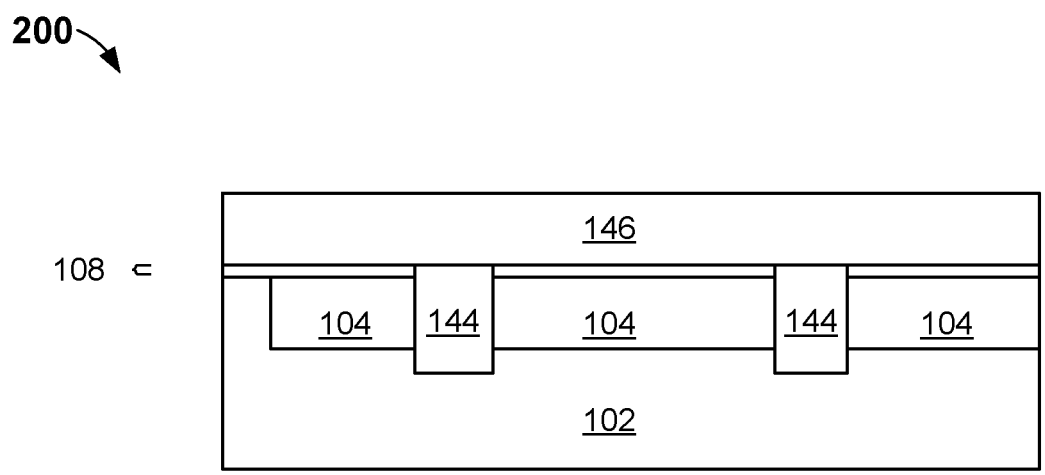

Referring now to FIGS. 11 and 12, a structure 200 is shown according to an exemplary embodiment. The structure 200 is an alternate embodiment formed from subsequent processing of the structure 100 as described above in FIGS. 5 and 6. FIG. 11 is a top view of the structure 200 and FIG. 12 is a cross-sectional side view of the structure 200 along section A-A. FIG. 12 is perpendicular to FIG. 11. As shown in FIGS. 11 and 12, a second post cap liner 144 and a third dielectric 146 may be formed.

The second post cap liner 144 may be conformally formed on the structure 100. The first post cap liner 124 may fill the cavities 116, 118, 120, 122. The second post cap liner 144 may cover an upper horizontal surface of the first top cap layer 108.

The second post cap liner 144 may be formed as described above in regards to the first post cap liner 124. The second post cap liner 144 may include the same material or a different material than the first post cap liner 124 or the second post cap liner 140. The second post cap liner 144 may help to avoid metallic migration into the first dielectric 102, or into other components of the structure 100, improve capacitance between trenches, provide metal segregation, and to reduce or discourage oxidation on the metallic material.

A chemical mechanical polishing (CMP) technique may be used to remove excess material and polish upper surfaces of the structure 200, removing any excess of the second post cap liner 144 and providing a uniform horizontal surface of the first top cap layer 108 and the second post cap liner 144 in the cavities 116, 118, 120, 122.

The third dielectric 146 may be formed as described above in regards to the first dielectric 102 on an upper horizontal surface of the first top cap layer 108 and an upper horizontal surface of the second post cap liner 144 in the cavities 116, 118, 120, 122. The third dielectric 146 may include the same or different materials of the first dielectric 102 or the second dielectric 126.

In this embodiment, the metal lines 104, 106 have portions removed, cutting each of the metal lines 104, 106, providing isolation between devices which are connected to each of the remaining portions of the metal lines 104, 106.

In this embodiment, after fabrication and CMP process into a pre-formed structure, the metal lines 104, 106 each have portions removed, cutting each of the metal lines 104, 106, providing isolation between devices which are connected to each of the remaining portions of the metal lines 104, 106.

Figure 13:
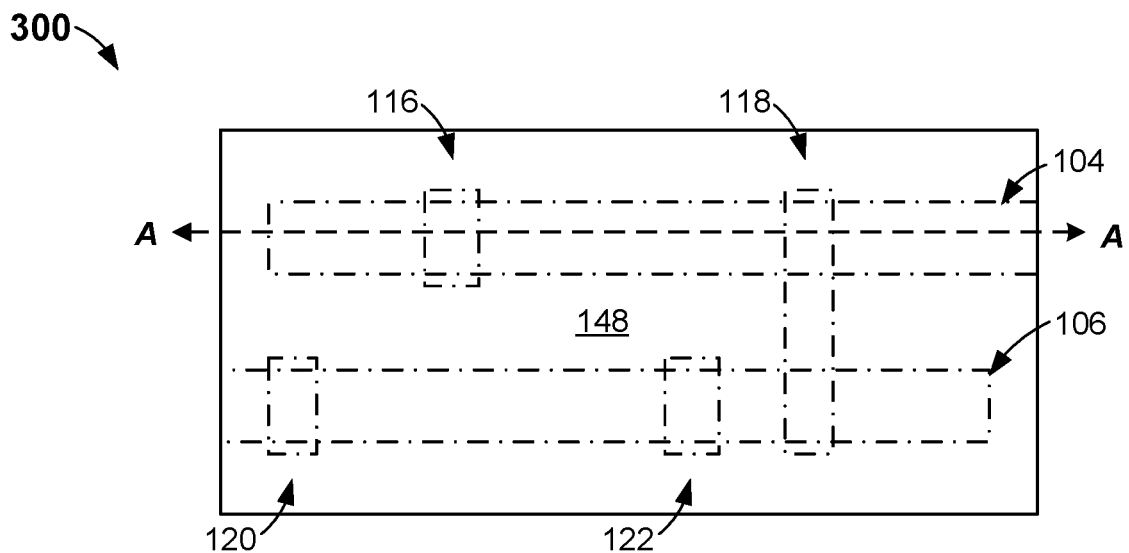
FIGS. 13 and 14 illustrate a top view and a cross sectional side view, respectively, of formation of an air gap, according to an exemplary embodiment.
Figure 14:
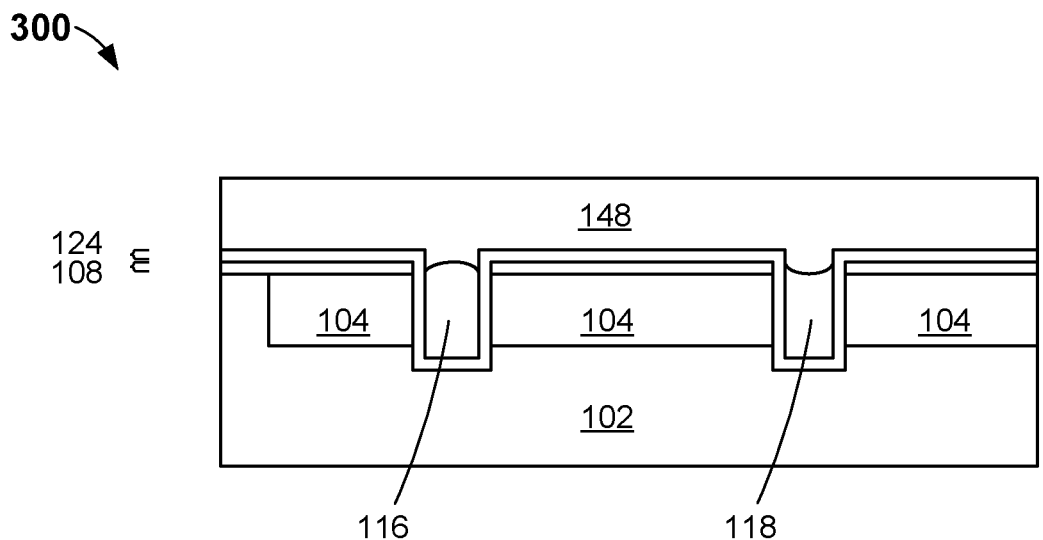
Figure 16:
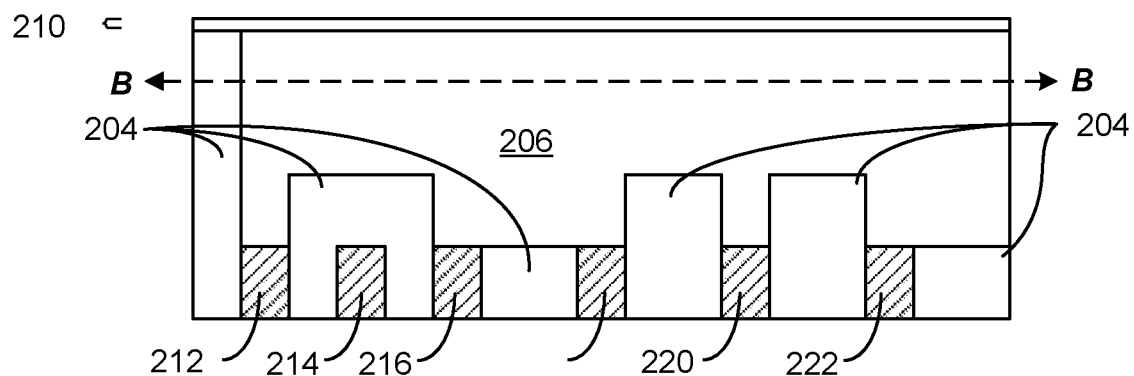

Referring now to FIGS. 13 and 14, a structure 300 is shown according to an exemplary embodiment. The structure 300 is an alternate embodiment formed from subsequent processing of the structure 100 as described above in FIGS. 7 and 8. FIG. 13 is a top view of the structure 300 and FIG. 16 is a cross-sectional side view of the structure 300 along section A-A. FIG. 14 is perpendicular to FIG. 13. As shown in FIGS. 13 and 14, a fourth dielectric 148 may be formed.

The fourth dielectric 148 may be formed as described above in regards to the first dielectric 102. The fourth dielectric 148 may include the same or different materials of the first dielectric 102, the second dielectric 126 or the third dielectric 146.

The fourth dielectric 148 may partially fill an upper portion of each of the cavities 116, 118, 120, 122. The fourth dielectric 148 may provide either a concave lower surface in each of the cavities 116, 118, 120, 122 or a convex lower surface in each of the cavities 116, 118, 120, 122. These two different embodiments may be controlled by deposition conditions.

The resulting structure 300 contains an air gap in each of the cavities 116, 118, 120, 122. Advantages of the air gap in each of the cavities 116, 118, 120, 122, include increased thermal and electrical isolation between devices which are connected to each of the remaining portions of the metal lines 104, 106.

Figure 15:
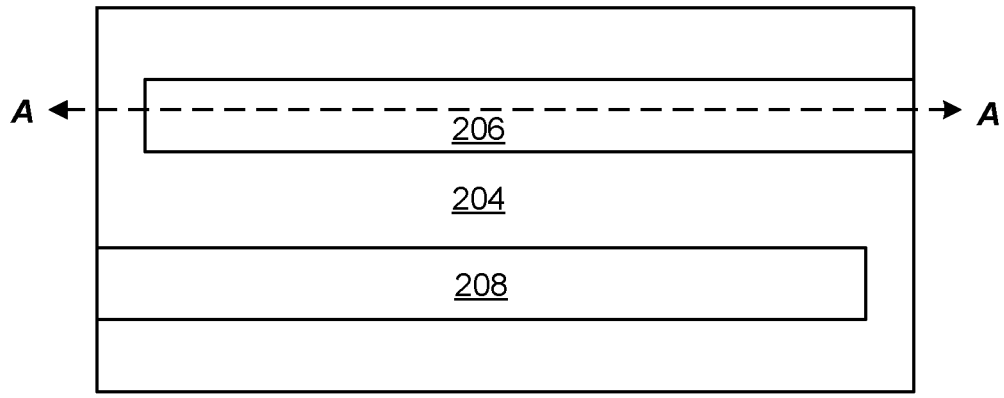
FIGS. 15 and 16 illustrate a cross-sectional top view and a cross sectional side view, respectively, of a semiconductor structure at an intermediate stage of fabrication, according to another exemplary embodiment.

Referring now to FIGS. 15 and 16, a semiconductor structure 400 (hereinafter "structure") at an intermediate stage of fabrication is shown according to an exemplary embodiment. FIG. 15 is a cross-sectional top view of the structure 400 along section B-B and FIG. 16 is a cross-sectional side view of the structure 400 along section A-A. FIG. 16 is perpendicular to FIG. 15.

The structure 400 may include several back end of line ("BEOL") layers below what is shown in FIGS. 15 and 16. In general, the back end of line (BEOL) is the second portion of integrated circuit fabrication where the individual devices (transistors, capacitors, resistors, etc.) are interconnected with wiring on the wafer. As shown in FIGS. 15 and 16, the structure 400 includes a fifth dielectric 204, a double damascene trench and via structure 206, and a double damascene trench and via structure 208, a second top cap layer 210 and lower metal lines 212, 214, 216, 218, 220 and 222. The double damascene trench and via structures 206, 208 may be parallel to each other. The lower metal lines 212, 214, 216, 218, 220 may be parallel to each other and be perpendicular to the double damascene trench and via structures 206, 208.

The fifth dielectric 204 may be formed as described above in regards to the first dielectric 102. The lower metal lines 212, 214, 216, 218, 220 and 222 may be formed from a previous metallization process such as a single damascene (SD) process, a dual damascene (DD) process or a subtractive etch. The lower metal lines 212, 214, 216, 218, 220 and 222 may be formed as and include a material as described above regarding metal lines 104, 106.

The double damascene trench and via structures 206 and 208 may be formed in the fifth dielectric 204 using a dual damascene (DD) scheme as described above in regards to the metal lines 104, 106. The lower metal lines 212, 214, 216, 218, 220 and 222 and double damascene trench and via structures 206, 208 are embedded in the fifth dielectric 204.

A CMP technique may be used to remove excess material and polish upper surfaces of the structure 400, providing a uniform horizontal surface.

The fifth dielectric 204, the lower metal lines 212, 214, 216, 218, 220 and 222 and the double damascene trench and via structures 206, 208 may be covered with a second top cap layer 210, as described above in regards to the first top cap layer 108.

Figure 17:
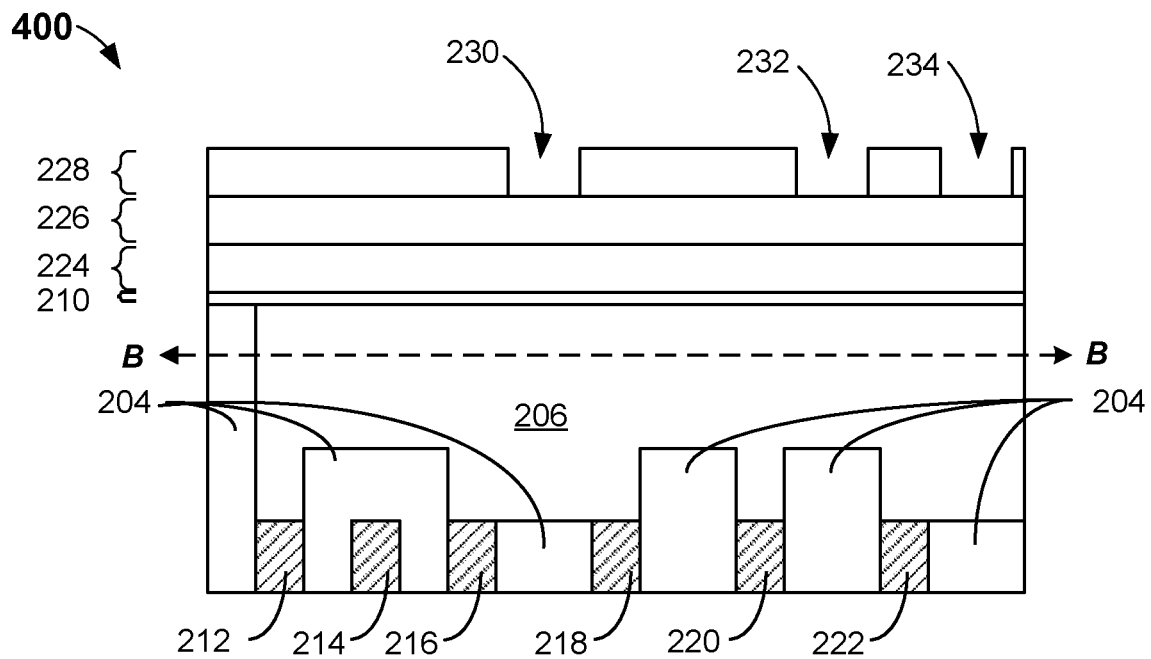
FIG. 17 illustrates a cross sectional side view of formation of an organic planarization layer material (OPL), a masking layer and a hard masking layer, according to an exemplary embodiment.

Referring now to FIG. 17, the structure 400 is shown according to an exemplary embodiment. FIG. 17 is a cross-sectional side view of the structure 100 along section A-A. As shown in FIG. 17, a second organic planarization layer material (hereinafter "OPL") 224, a second hard mask 226 and a second masking layer 228 may be formed, according to an exemplary embodiment.

The second OPL 224 may be formed on the second top cap layer 210 as described above in regards to the first OPL 110. The second hard mask 226, may be formed on the structure 400 on the second OPL 110 as described above in regards to the first hard mask 112.

The second masking layer 228 may be formed on the structure 400 as described above in regards to the first masking layer 114. The second masking layer 228 may be patterned with cavity 230, cavity 232 and cavity 234.

Figure 18:
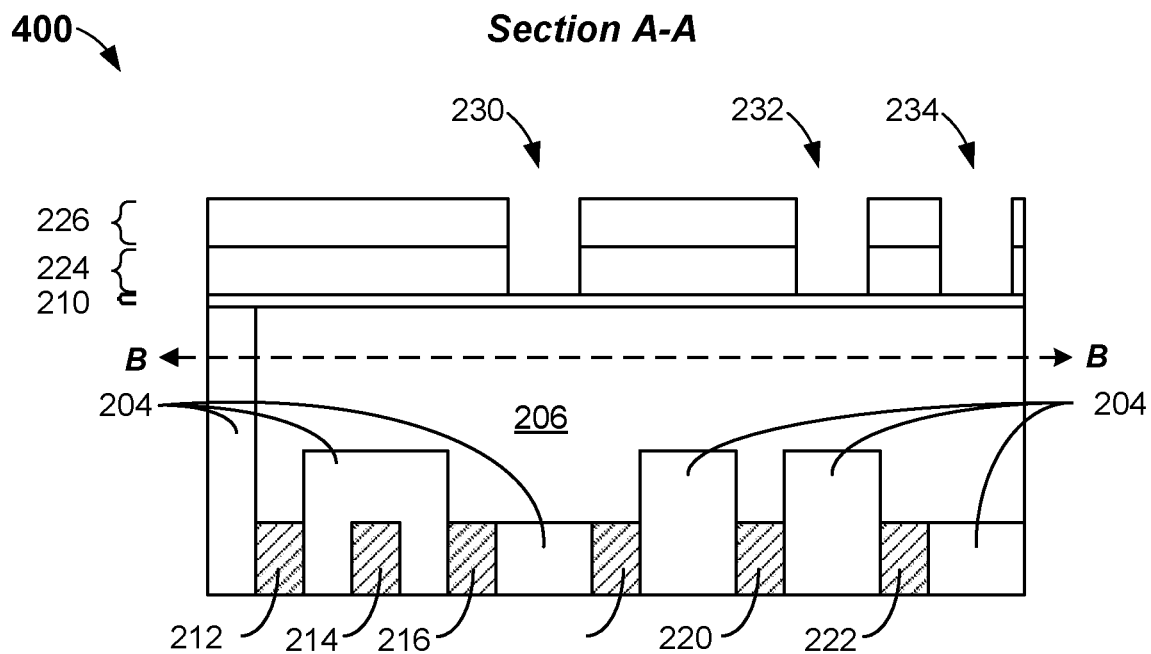
FIG. 18 illustrates a cross sectional side view of selective removal of portions of the OPL and removal of the hard masking layer, according to an exemplary embodiment.

Referring now to FIG. 18, the structure 400 is shown according to an exemplary embodiment. FIG. 18 is a cross-sectional side view of the structure 400 along section A-A. As shown in FIG. 18, portions of the second hard mask 226 and portions of the second OPL 224 may be removed and the second masking layer 228 may be removed.

Portions of the second hard mask 226 and portions of the second OPL 224 may each be selectively removed in locations of the cavities 230, 232, 234, increasing a depth of the cavities 230, 232 and 234, and may be removed in one or more steps, exposing an upper surface of the second top cap layer 210. The portions of the second hard mask 226 and portions of the second OPL 224 may be removed by, for example, dry etch, selective to the second masking layer 228 and the second cap layer 210.

The second masking layer 228 may be selectively removed, selective to the second hard mask 226 and th3 second top cap layer 210. The second hard mask 226 may be removed, selective to the second OPL 224 and the second cap layer 210.

Figure 19:
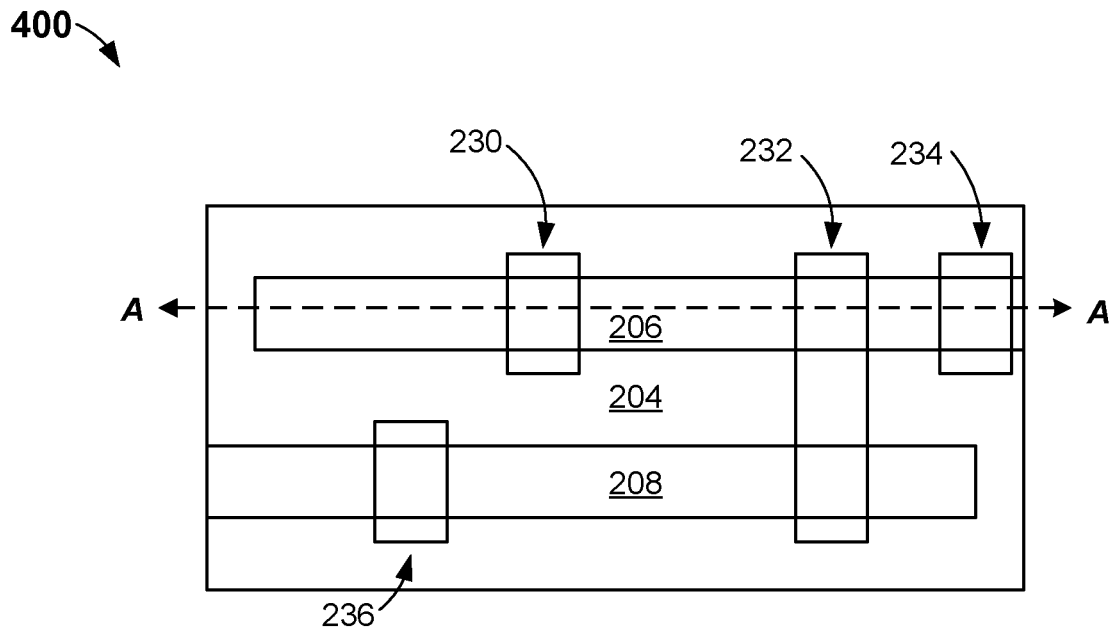
FIGS. 19 and 20 illustrate a cross-sectional top view and a cross sectional side view, respectively, of forming cavities, according to an exemplary embodiment.
Figure 20:
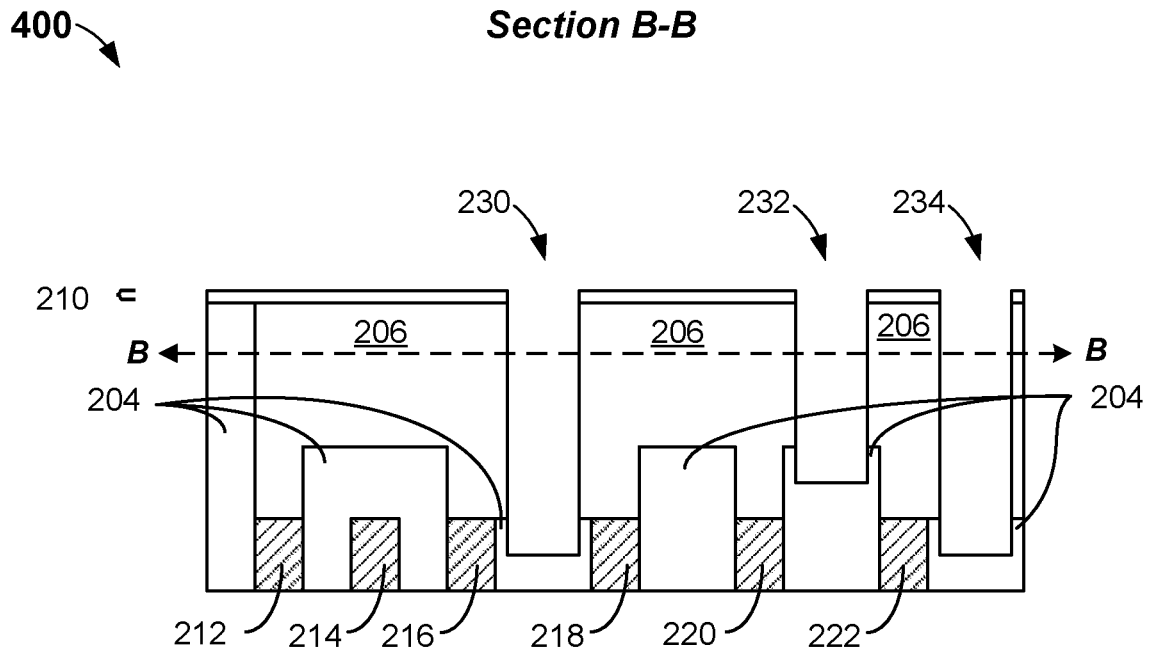

Referring now to FIGS. 19 and 20, the structure 400 is shown according to an exemplary embodiment. FIG. 19 is a cross-sectional top view of the structure 400 along section B-B and FIG. 20 is a cross-sectional side view of the structure 400 along section A-A. FIG. 20 is perpendicular to FIG. 19. As shown in FIGS. 19 and 20, portions of the double damascene trench and via structure 206 and portions of the second top cap layer 210 may be removed. The second masking layer 228, the second hard mask 226 and the second OPL 224 may be removed.

The portions of the second cap layer 210, the portions of the double damascene trench and via structure 206 may be removed aligned with the cavities 230, 232, 234 increasing a depth of the cavities 230, 232, 234 using, for example, reactive ion etching (RIE), using highly selective etch chemistries to etch the double damascene trench and via structure 206, as described above. The fifth dielectric 204 may have a small recess, as shown, in a range of approximately less than 5 nm in depth. The portions of the second top cap layer 210 and the portions of the double damascene trench and via structure 206 which are removed may be completely removed in alignment with the cavities 230, 232, 234. A vertical side surface of the cavities 230, 232, 234 includes the fifth dielectric 204 and the double damascene trench and via structure 206.

The second OPL 224 may each be selectively removed using known techniques and may be removed in one or more steps, using, for example, a dry etch. The second OPL 224 may be removed either separately or concurrently with removal of the portions of the second top cap layer 210, the portions of the double damascene trench and via structure 206 and the portions of the fifth dielectric 204.

As shown in FIG. 19, there may be additional cavities formed, including cavity 236 formed in double damascene trench and via structure 208. The cavity 236 is formed using a similar method as described above, and may be formed concurrently. The cavities 230, 232, 234 may be formed in portions of the double damascene trench and via structure 206. The cavity 232 may be formed across more than one metal line, and as shown in FIG. 5, is formed across the double damascene trench and via structure 206 and extend across the double damascene trench and via structure 208. Any combination of cavities may be formed in the structure 400 and may extend across one or more metal lines. The cavities formed may each form a cut in a metal line, forming a break in conductively of portions of the applicable metal line.

Figure 21:
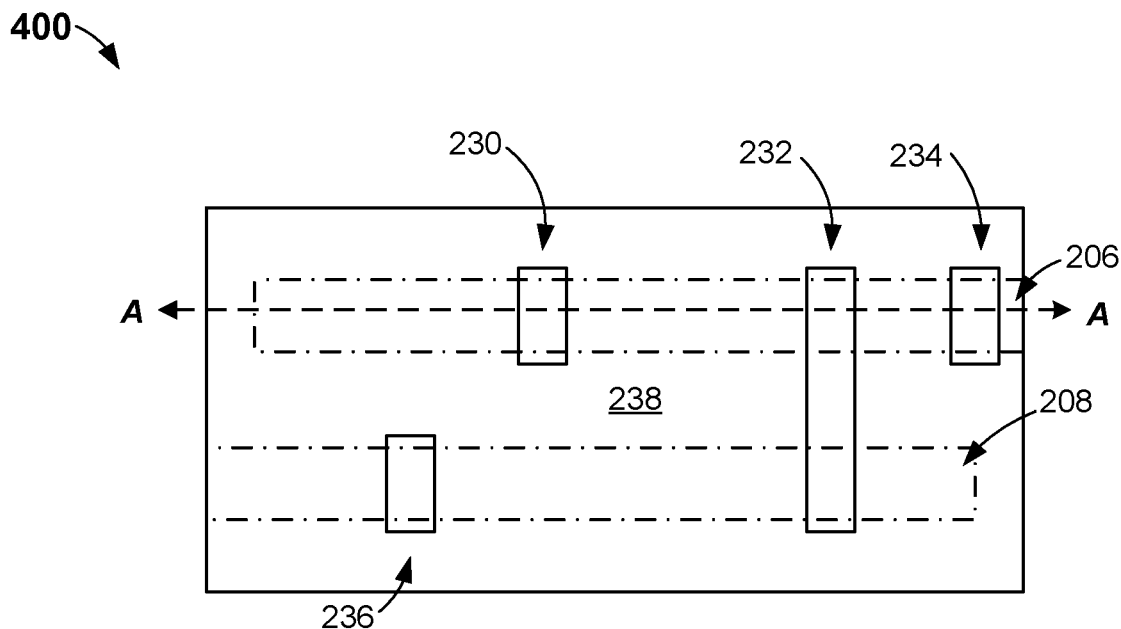
FIGS. 21 and 22 illustrate a top view and a cross sectional side view, respectively, of formation of a post cap liner, according to an exemplary embodiment.
Figure 22:
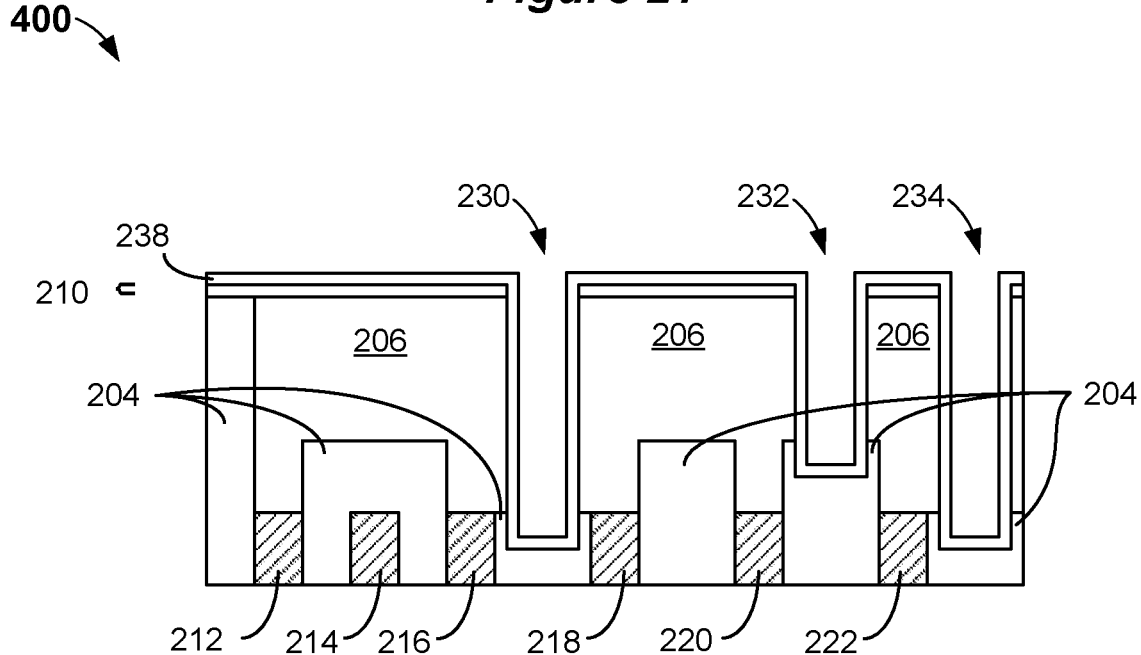

Referring now to FIGS. 21 and 22, the structure 400 is shown according to an exemplary embodiment. FIG. 21 is a top view of the structure 400 and FIG. 22 is a cross-sectional side view of the structure 400 along section A-A. FIG. 22 is perpendicular to FIG. 21. As shown in FIGS. 21 and 22, a fourth post cap liner 238 may be formed.

The fourth post cap liner 238 may be conformally formed on the structure 400. The fourth post cap liner 238 may provide a liner on vertical side surfaces and horizontal lower surfaces of the cavities 230, 232, 234, making each of the cavities 230, 232, 234 slightly smaller. The fourth post cap liner 238 may cover an upper horizontal surface of the second top cap layer 210 and vertical sides surfaces of the fifth dielectric 204 along each of the cavities 230, 232, 234.

The fourth post cap liner 238 can be formed as described above in regards to the first post cap liner 124.

Figure 23:
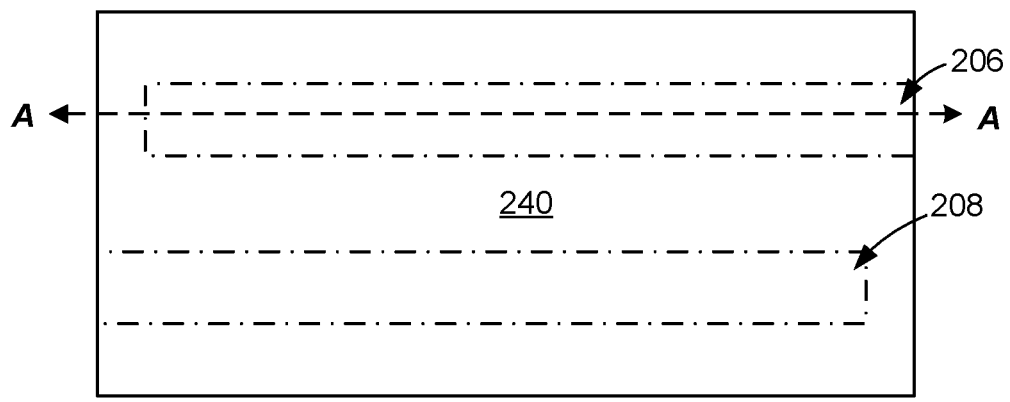
FIGS. 23 and 24 illustrate a top view and a cross sectional side view, respectively, of formation of a dielectric, according to an exemplary embodiment.
Figure 24:
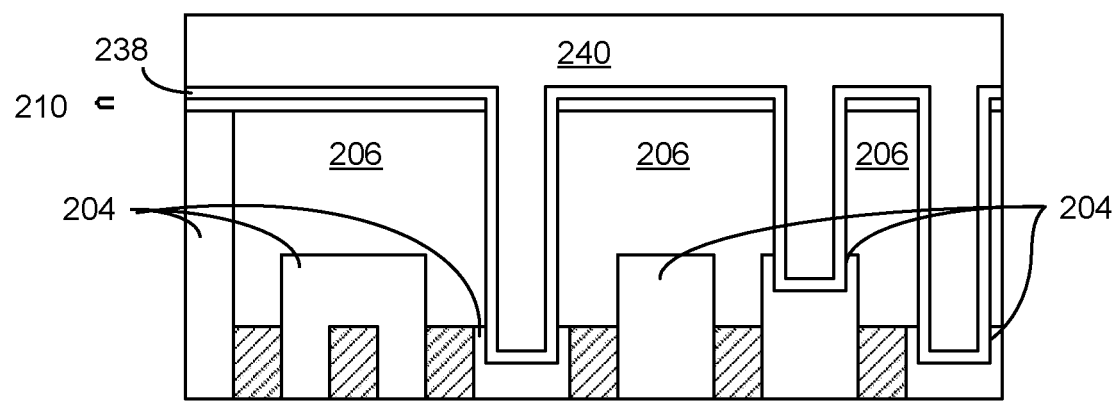

Referring now to FIGS. 23 and 24, the structure 400 is shown according to an exemplary embodiment. FIG. 23 is a top view of the structure 400 and FIG. 24 is a cross-sectional side view of the structure 400 along section A-A. FIG. 24 is perpendicular to FIG. 23. As shown in FIGS. 23 and 24, a sixth dielectric 240 may be formed.

The sixth dielectric 240 may be formed as described above in regards to the first dielectric 102. The sixth dielectric 240 may be the same or a different material as the fifth dielectric 204. The sixth dielectric 240 may fill the cavities 230, 232, 234, 236 and cover an upper horizontal surface of the fourth post cap liner 238.

A chemical mechanical polishing (CMP) technique may be used to remove excess material and polish upper surfaces of the structure 400, providing a uniform horizontal surface.

In this embodiment, the double damascene trench and via structures 206, 208 have portions removed, cutting each of the double damascene trench and via structures 206, 208, providing isolation between devices which are connected to each of the remaining portions of the double damascene trench and via structures 206, 208.

Figure 25:
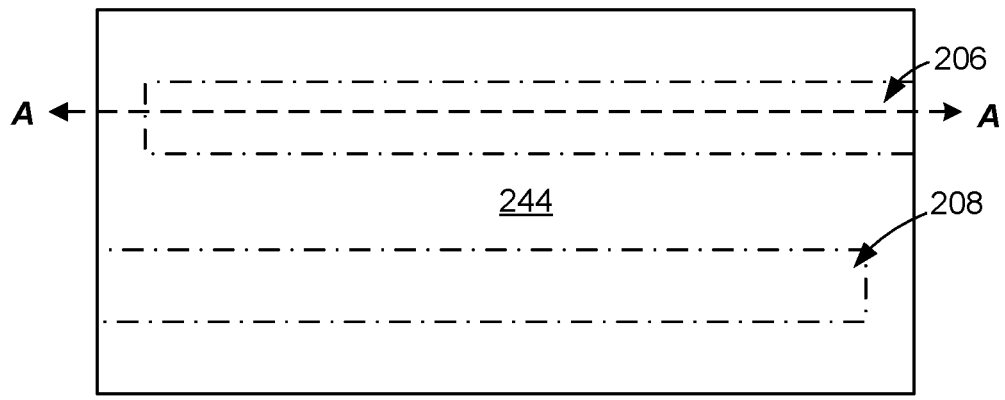
FIGS. 25 and 26 illustrate a top view and a cross sectional side view, respectively, of formation of a post cap liner fill, according to an exemplary embodiment.
Figure 26:
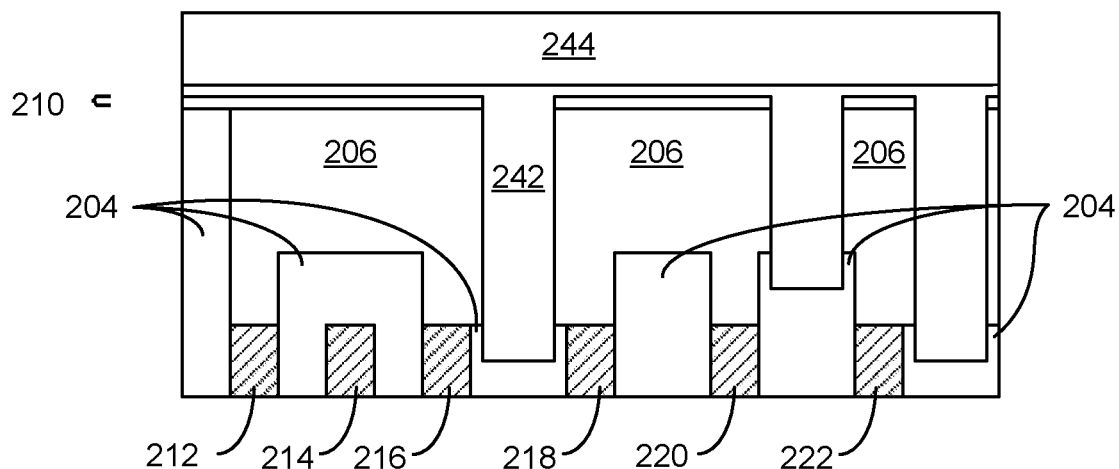

Referring now to FIGS. 25 and 26, a structure 500 is shown according to an exemplary embodiment. The structure 500 is an alternate embodiment formed from subsequent processing of the structure 400 as described above in FIGS. 19 and 20. FIG. 25 is a top view of the structure 500 and FIG. 26 is a cross-sectional side view of the structure 500. As shown in FIGS. 25 and 26, a fifth post cap liner 242 and a seventh dielectric 244 may be formed.

The fifth post cap liner 242 may be conformally formed on the structure 500. The fifth post cap liner 242 may fill the cavities 230, 232, 234, 236. The fifth post cap liner 242 may cover an upper horizontal surface of the second top cap layer 210.

The fifth post cap liner 242 may be formed as described above in regards to the first post cap liner 124. The fifth post cap liner 242 may include the same material or a different material than the fourth post cap liner 238.

A chemical mechanical polishing (CMP) technique may be used to remove excess material and polish upper surfaces of the structure 500, providing a uniform horizontal surface of the fifth post cap liner 242.

The seventh dielectric 244 may be formed as described above in regards to the first dielectric 102. The seventh dielectric 244 may include the same or different materials of the fifth dielectric 204 or the sixth dielectric 240.

In this embodiment, the double damascene trench and via structures 206, 208 have portions removed, cutting each of the double damascene trench and via structures 206, 208, providing isolation between devices which are connected to each of the remaining portions of the double damascene trench and via structures 206, 208.

Figure 27:
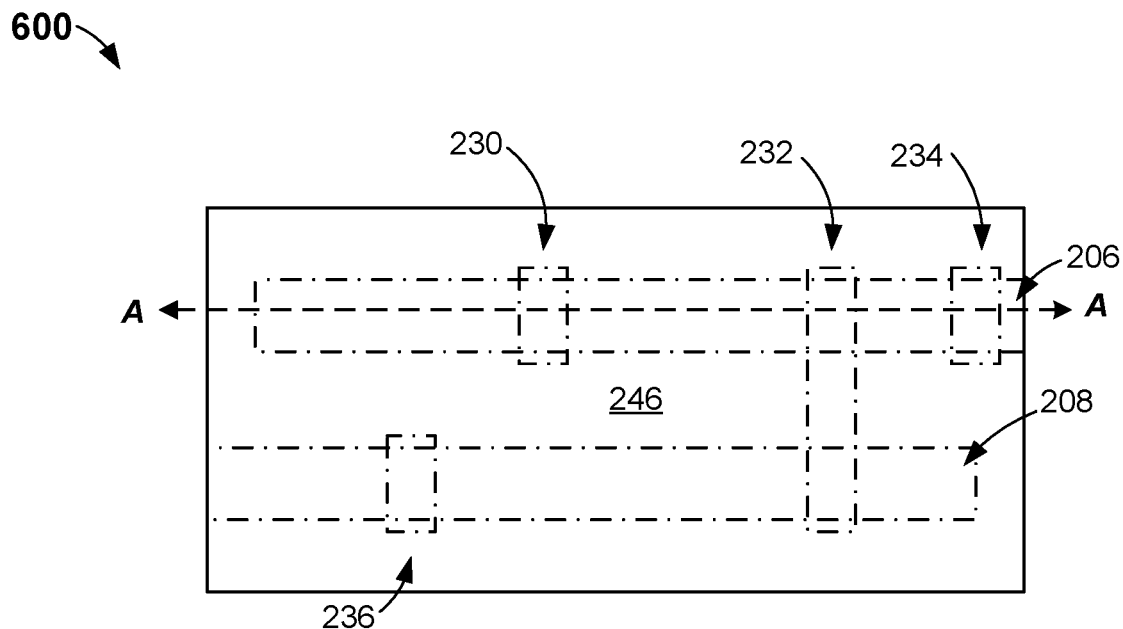
FIGS. 27 and 28 illustrate a top view and a cross sectional side view, respectively, of formation of an air gap, according to an exemplary embodiment.
Figure 28:
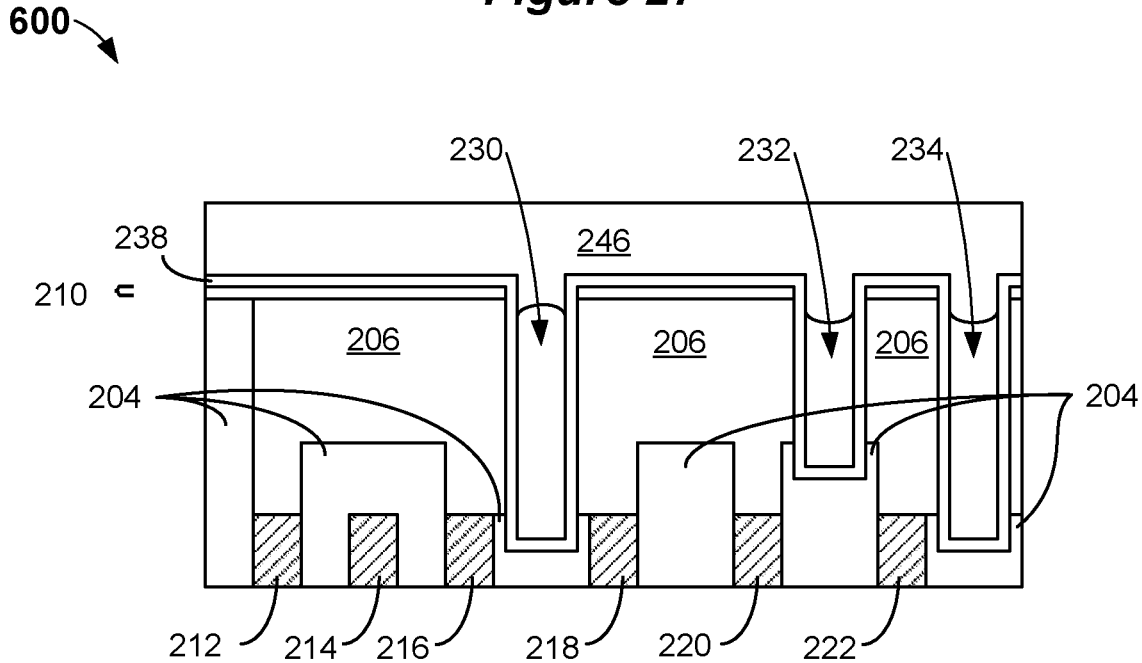

Referring now to FIGS. 27 and 28, a structure 600 is shown according to an exemplary embodiment. The structure 600 is an alternate embodiment formed from subsequent processing of the structure 400 as described above in FIGS. 21 and 22. FIG. 27 is a top view of the structure 600 and FIG. 28 is a cross-sectional side view of the structure 600 along section A-A. FIG. 28 is perpendicular to FIG. 27. As shown in FIGS. 27 and 28, an eighth dielectric 246 may be formed.

The eighth dielectric 246 may be formed as described above in regards to the first dielectric 102. The eighth dielectric 246 may include the same or different materials of the fifth dielectric 204, the sixth dielectric 240 or the seventh dielectric 244.

The eighth dielectric 246 may partially fill an upper portion of each of the cavities 230, 232, 234, 236. The eighth dielectric 246 may provide either a concave lower surface in each of the cavities 230, 232, 234, 236 or a convex lower surface in each of the cavities 230, 232, 234, 236. These two different embodiments may be controlled by deposition conditions.

The resulting structure 600 contains an air gap in each of the cavities 230, 232, 234, 236. Advantages of the air gap in each of the cavities 230, 232, 234, 236, include increased thermal and electrical isolation between devices which are connected to each of the remaining portions of the double damascene trench and via structures 206, 208.

Figure 29:
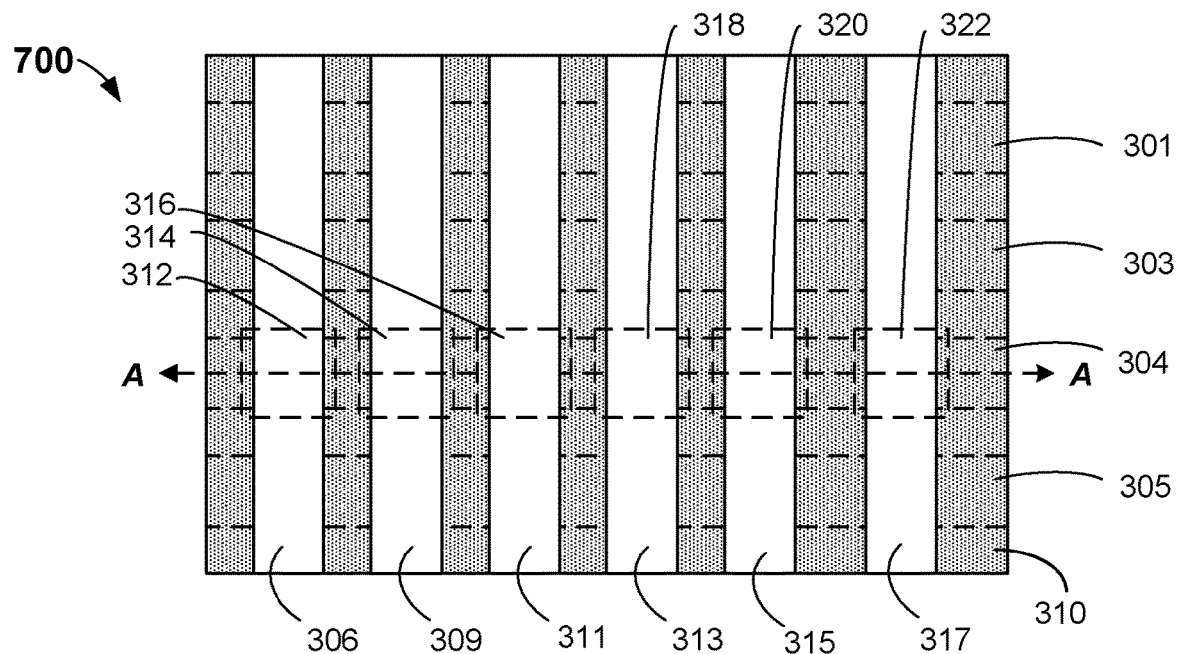
FIGS. 29 and 30 illustrate a top view and a cross sectional side view, respectively, of a semiconductor structure at an intermediate stage of fabrication, according to another exemplary embodiment.
Figure 30:
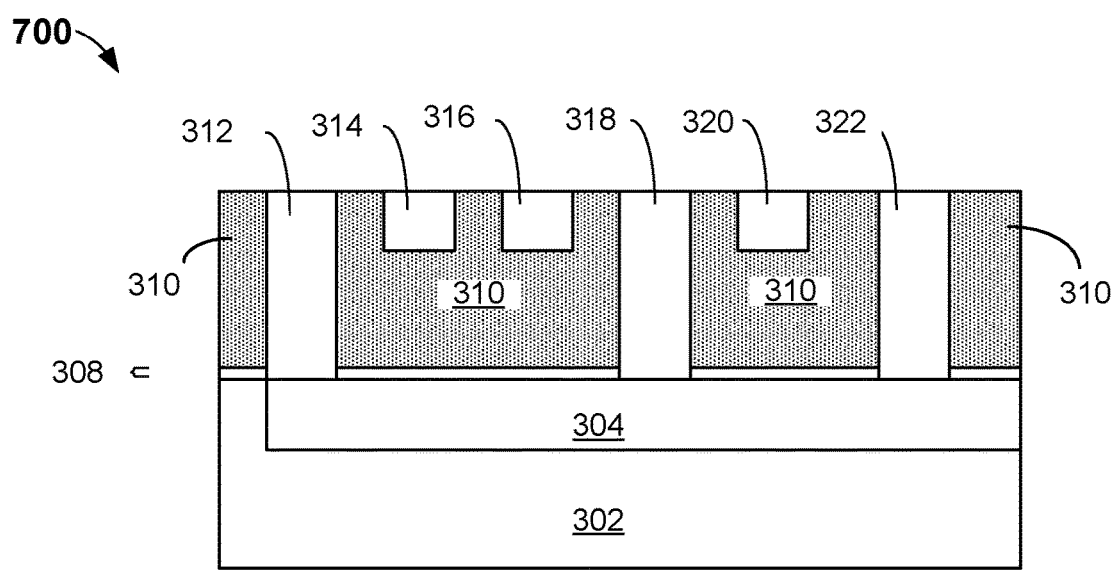

Referring now to FIGS. 29 and 30, a semiconductor structure 700 (hereinafter "structure") at an intermediate stage of fabrication is shown according to an exemplary embodiment. FIG. 29 is a top view of the structure 700 and FIG. 30 is a cross-sectional side view of the structure 700 along section A-A. FIG. 30 is perpendicular to FIG. 29.

The structure 700 may include several back end of line ("BEOL") layers below what is shown in FIGS. 29 and 30. In general, the back end of line (BEOL) is the second portion of integrated circuit fabrication where the individual devices (transistors, capacitors, resistors, etc.) are interconnected with wiring on the wafer. As shown in FIGS. 29 and 30, the structure 700 includes a ninth dielectric 302, a first set of lower metal lines, which includes metal line 301, metal line 303, metal line 304 and metal line 305, a second set of upper metal lines, which includes metal line 306, metal line 309, metal line 311, metal line 313, metal line 315 and metal line 317, vias 312, 318 and 322, a third top cap layer 308, a tenth dielectric 310. The box 314 is a portion of the metal line 309. The box 316 is a portion of the metal line 311. The box 320 is a portion of the metal line 315.

The via 312 connects the metal line 304 and the metal line 306. The via 318 connects the metal line 304 and the metal line 313 and the via 322 connects the metal line 304 and the metal line 317. The first set of lower metal lines may be perpendicular to the second set of upper metal lines and may be perpendicular to the vias 312, 318, 322. The second set of upper metal lines may be perpendicular to the vias 312, 318, 322.

The ninth dielectric 302 and the tenth dielectric 310 may be formed as described above in regards to the first dielectric 102.

Trenches (not shown) may be formed in the ninth dielectric 302, as described above in regards to the first metal line 104, to form the first set of lower metal lines. Trenches (not shown) may be formed in the tenth dielectric 310, as described above in regards to the first metal line 104, to form the second set of upper metal lines and the vias 312, 318, 322. The first set of lower metal lines, the second set of upper metal lines and the vias 312, 318, 322 may include material as described above in regards to the metal line 104.

A CMP technique may be used to remove excess material and polish upper surfaces of the structure 700, providing a uniform horizontal surface.

The ninth dielectric 302 and the first set of lower metal lines may be covered with the third top cap layer 308, as described above in regards to the first top cap layer 108.

Figure 31:
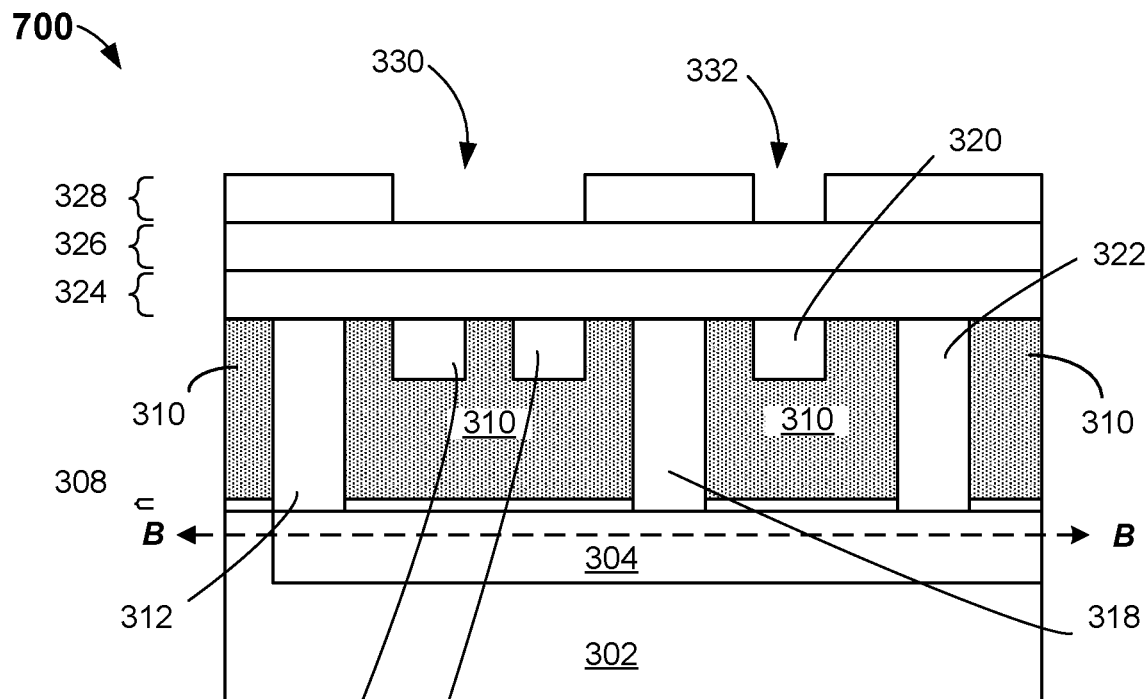
FIG. 31 illustrates a cross sectional side view of formation of an organic planarization layer material (OPL), a hard mask layer and a masking layer, according to an exemplary embodiment.

Referring now to FIG. 31, the structure 700 is shown according to an exemplary embodiment. FIG. 31 is a cross-sectional side view of the structure 100 along section A-A. As shown in FIG. 31, a third organic planarization layer material (hereinafter "OPL") 324, a third hard mask 326 and a third masking layer 328 may be formed, according to an exemplary embodiment;

The third OPL 324 may be formed on the structure 700, covering the tenth dielectric 310, the vias 312, 318, 322, and the second set of upper metal lines, as described above in regards to the first OPL 110. As the third OPL 324 covers the second set of upper metal lines, the third OPL 324 covers the boxes 314, 316, 320. The third hard mask 326, may be formed on the structure 700 on the third OPL 324 as described above in regards to the first hard mask 112. The third masking layer 328 may be formed on the structure 700 as described above in regards to the first masking layer 114. The third masking layer 328 may be patterned with cavity 330 and cavity 332.

Figure 32:
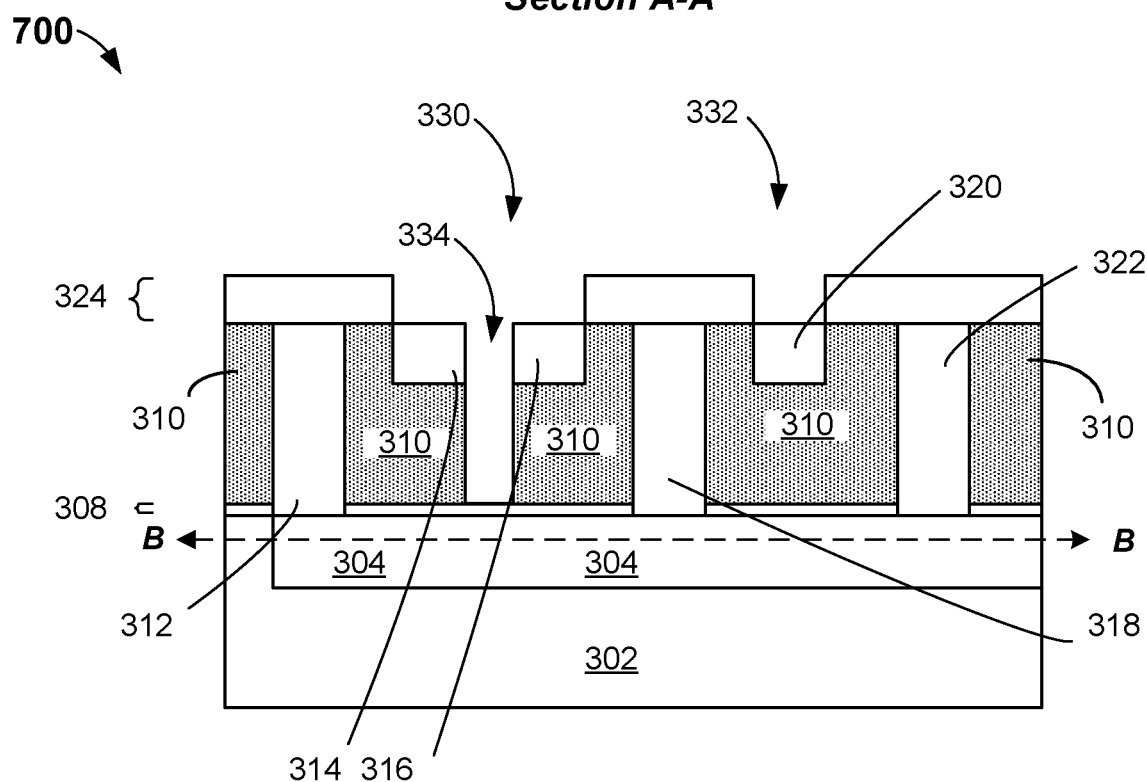
FIG. 32 illustrates a cross sectional side view of selective removal of portions of the OPL and the hard mark layer, removing the masking layer, and forming a cavity, according to an exemplary embodiment.

Referring now to FIG. 32, the structure 700 is shown according to an exemplary embodiment. FIG. 32 is a cross-sectional side view of the structure 700 along section A-A. As shown in FIG. 32, portions of the third hard mask 326, portions of the third OPL 324 may be removed, the third masking layer 328 and the third hard mask 326 may be removed, and a cavity 334 may be formed in the tenth dielectric 310.

Portions of the third hard mask 326 and portions of the third OPL 324 may each be selectively removed in locations of the cavities 330, 332, increasing a depth of the cavities 330, 332, and may be removed in one or more steps, exposing an upper surface of the tenth dielectric 310, and the boxes 314, 316, 320. The boxes 314, 316, 320 may each be an exposed portion of the metal lines 309, 311, 315, respectively, meaning they each are an opening of the third masking layer 328 which will subsequently be used to each form a cavity in the structure 700.

The third masking layer 328 may be selectively removed, selective to third hard mask 326, the third OPL 324, the vias 312, 318, 322, the boxes 314, 316, 320, and the tenth dielectric 310. The third masking layer 328 may be removed by, for example, dry etch. The portions of the third hard mask 326 and portions of the third OPL 324 may be removed by, for example, dry etch, selective to the tenth dielectric 310 and the boxes 314, 316, 320.

A portion of the tenth dielectric 310 may be selectively removed between the metal boxes 314, 316, resulting in a cavity 334. The portion of the tenth dielectric 310 may be removed in one or more steps, exposing an upper surface of the third top cap layer 308. The portion of the tenth dielectric 310 may be removed by, for example, an oxide etch via RIE, selective to the third OPL 324 and the boxes 314, 316, 320. During this sequence, the third hard mask 326 may be removed at the same time. A selective etch may be performed to form the cavity 334 which may stop on the third top cap layer 308.

The cavity 334 may be below the cavity 330. The cavity 334 may have a vertical side surface which includes vertical side surfaces of the tenth dielectric 310 and vertical side surfaces of the metal lines 309, 311. The cavity 334 may have a horizontal bottom surface which includes an upper horizontal surface of the third top cap layer 308.

Figure 33:
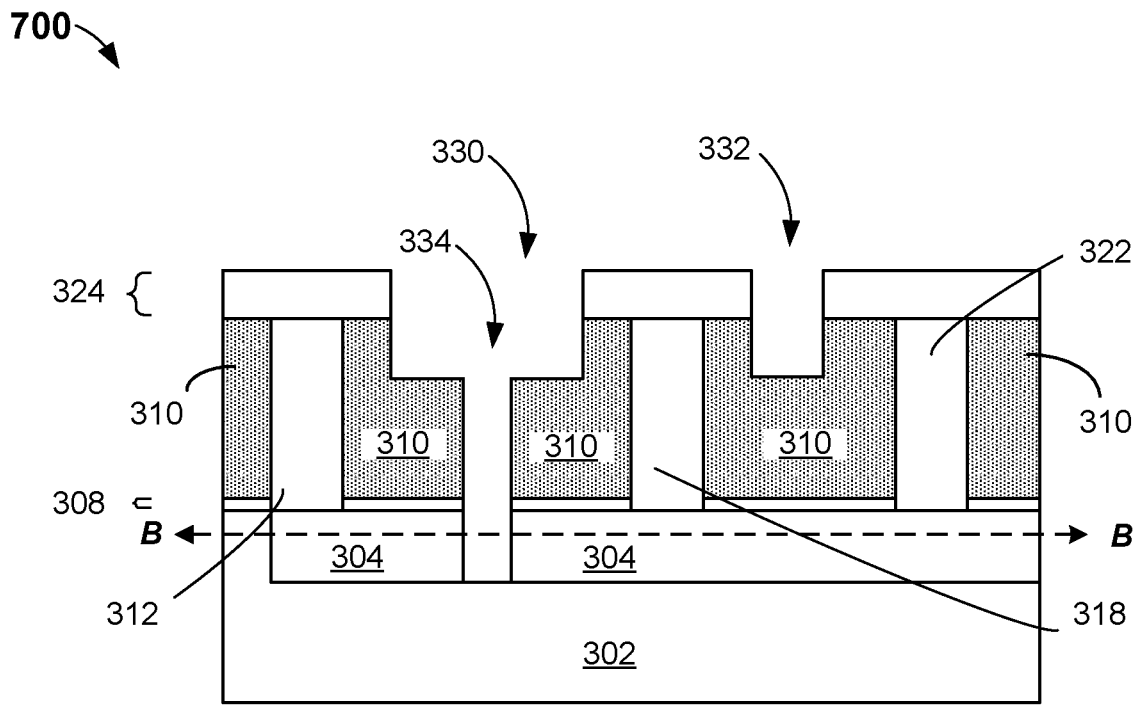
FIG. 33 illustrates a cross sectional side view of forming cavities, according to an exemplary embodiment.

Referring now to FIG. 33, the structure 700 is shown according to an exemplary embodiment. FIG. 33 is a cross-sectional side view of the structure 700 along section A-A. As shown in FIG. 33, areas of the boxes 314, 316, 320, a portion of the third top cap layer 308 and a portion of a first metal line of the first set of metal lines 304 may be removed.

The areas of the boxes 314, 316, 320, the portion of the third top cap layer 308 and the portion of the metal line 304 may each be selectively removed in locations of the cavities 330, 332, 334, increasing a width of the cavity 330 and a depth of the cavities 332, 334, and may be removed in one or more steps, exposing an upper horizontal surface of the tenth dielectric 310, and an upper horizontal surface of the ninth dielectric 302. The areas of the boxes 314, 316, 320, the portion of the third top cap layer 308 and the portion of the first metal line of the first set of metal lines 304 may be removed by, for example, dry etch, selective to the third OPL 324, the tenth dielectric 310 and the ninth dielectric 302.

A depth of the cavity 334 may increase, removing portions of the third top cap layer 308 and portions of the first metal line of the first set of metal lines 304. The cavity 334 may have a vertical side surface which includes vertical side surfaces of the tenth dielectric 310, the third top cap layer 308 and the metal line 304. The cavity 334 may have a horizontal bottom surface which includes an upper horizontal surface of the ninth dielectric 302.

Figure 34:
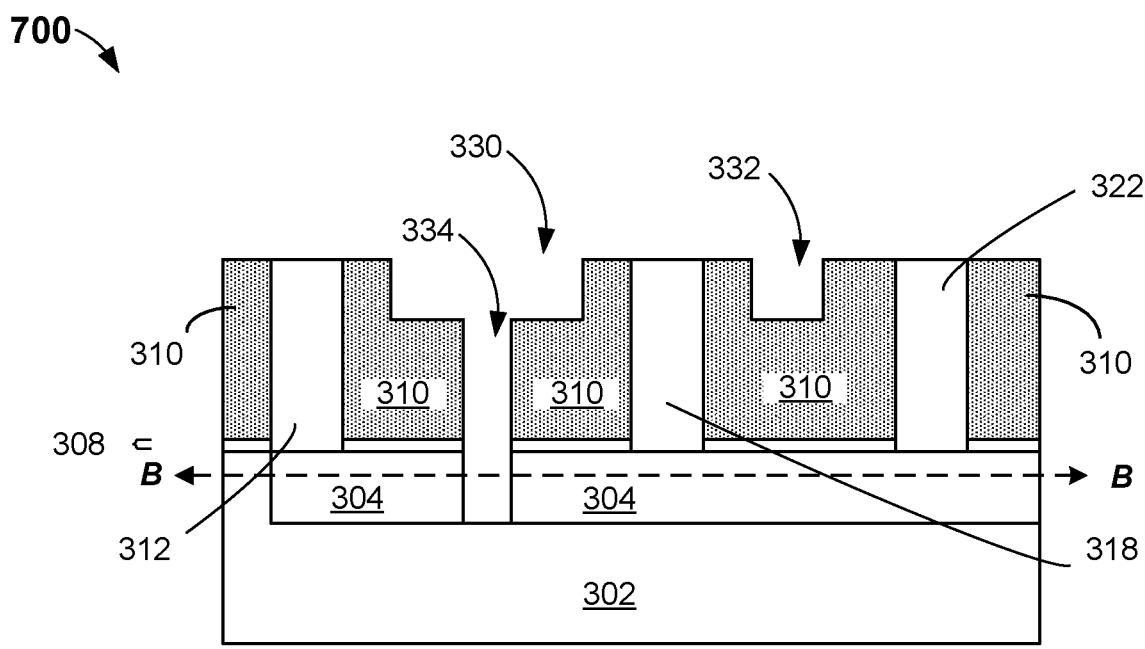
FIG. 34 illustrates a cross sectional side view of removal of remaining portions of the hard mask layer, the masking layer and the OPL, according to an exemplary embodiment.

Referring now to FIG. 34, the structure 700 is shown according to an exemplary embodiment. FIG. 34 is a cross-sectional top view of the structure 700 along section A-A. As shown in FIG. 34, the third OPL 324 may be removed.

The third OPL 324 may be selectively removed using known techniques and may be removed in one or more steps, using, for example, a dry etch.

Figure 35:
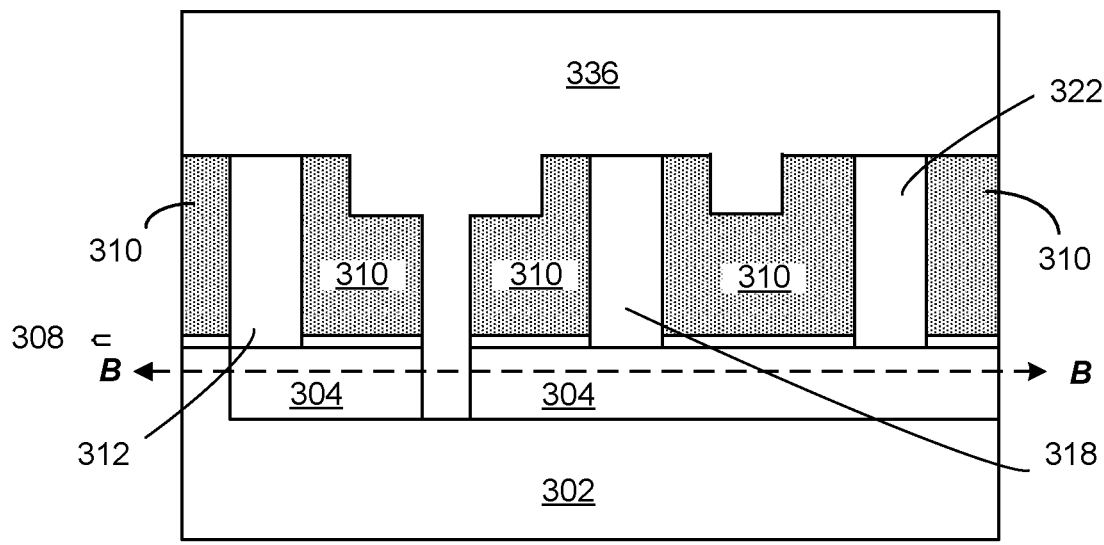
FIG. 35 illustrates a cross sectional side view of formation of a dielectric, according to an exemplary embodiment.

Referring now to FIG. 35, the structure 700 is shown according to an exemplary embodiment. FIG. 35 is a cross-sectional side view of the structure 700 along section A-A. As shown in FIG. 35, an eleventh dielectric 336 may be formed.

The eleventh dielectric 336 may be formed as described above in regards to the first dielectric 102. The eleventh dielectric 336 may be the same or a different material as the ninth dielectric 302 and the tenth dielectric 310. The eleventh dielectric 336 may fill the cavities 330, 332, 334. The eleventh dielectric 336 may cover an upper horizontal surface of the tenth dielectric 310 and the vias 312, 318, 322.

A chemical mechanical polishing (CMP) technique may be used to remove excess material and polish upper surfaces of the structure 700, providing a uniform horizontal surface.

In this embodiment, the first metal line of the first set of metal lines 304 has portions removed and areas of the boxes 314, 316, 320, providing isolation between devices which are connected to each of the remaining portions of the first metal line of the first set of metal lines 304. Additional cavities may be formed in any of the first, second set of metal lines 304, 306, may be formed in any of the vias and of the structure 700 across one or more of any of the first, second set of metal lines 304, 306 and may be formed in the tenth dielectric 310, the third top cap layer 308 and either the first, second set of metal lines 304, 306.

Figure 36:
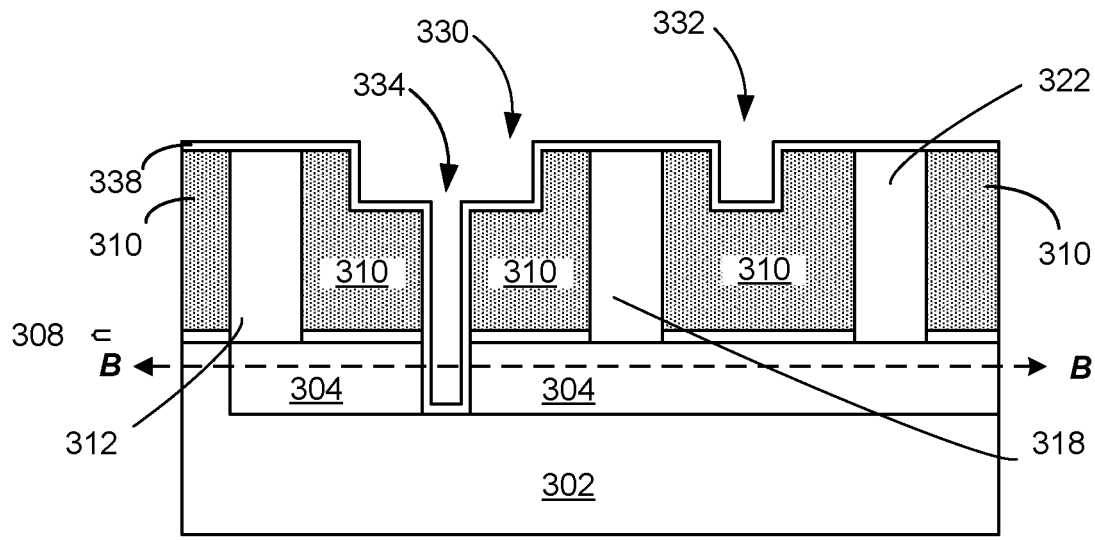
FIG. 36 illustrates a cross sectional side view of formation of a post cap liner, according to an exemplary embodiment.

Referring now to FIG. 36, a structure 800 is shown according to an exemplary embodiment. FIG. 36 is a cross-sectional side view of the structure 800 along section A-A. As shown in FIG. 36, a sixth post cap liner 338 may be formed. The structure 800 is an alternate embodiment formed from subsequent processing of the structure 700 as described above in FIG. 34.

The sixth post cap liner 338 may be conformally formed on the structure 800. The sixth post cap liner 338 may provide a liner on vertical side surfaces and horizontal lower surfaces of the cavities 330, 332, 334, making each of the cavities 330, 332, 334 slightly smaller. The sixth post cap liner 338 may cover an upper horizontal surface of the tenth dielectric 310 and the vias 312, 318, 322. The sixth post cap liner 338 can be formed as described above in regards to the first post cap liner 124.

Figure 37:
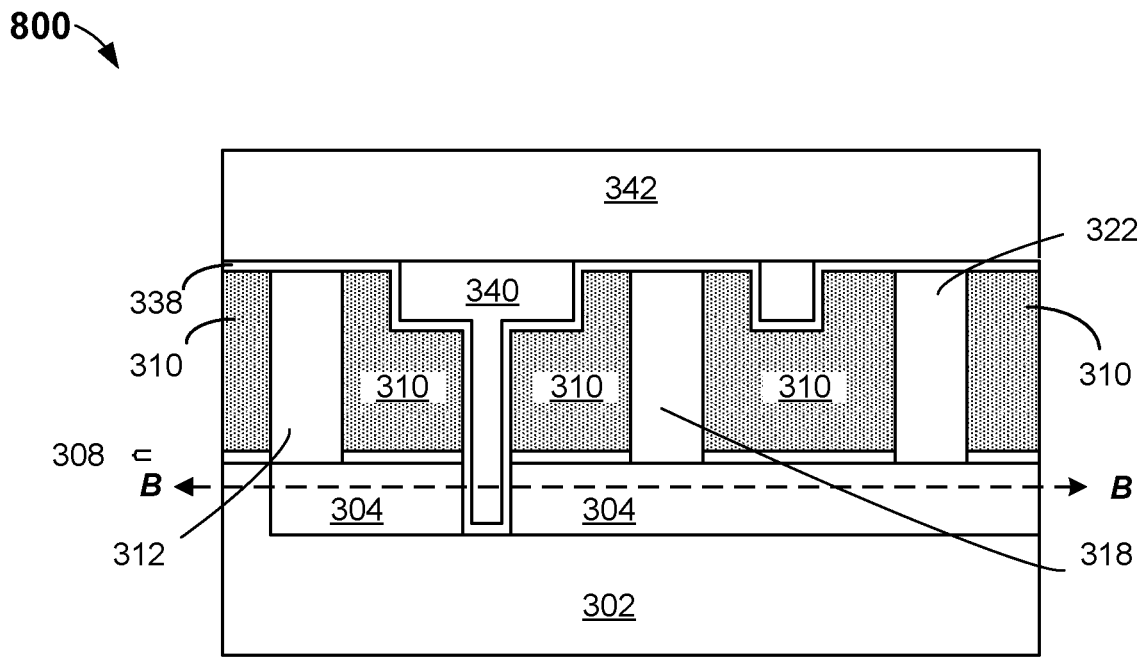
FIG. 37 illustrates a cross sectional side view of formation of a dielectric, according to an exemplary embodiment.

Referring now to FIG. 37, the structure 800 is shown according to an exemplary embodiment. FIG. 37 is a cross-sectional side view of the structure 800 along section A-A. As shown in FIG. 37, a twelfth dielectric 340 and a thirteenth dielectric 342 may be formed.

The twelfth dielectric 340 may be formed as described above in regards to the first dielectric 102. The twelfth dielectric 340 may include the same or different materials of the ninth dielectric 302, the tenth dielectric 310 and the eleventh dielectric 336. The twelfth dielectric 340 may fill the cavities 330, 332, 334. In an embodiment, different dielectrics may fill each of the cavities 330, 332, 334.

A chemical mechanical polishing (CMP) technique may be used to remove excess material and polish upper surfaces of the structure 800, providing a uniform horizontal surface of the twelfth dielectric 340 which is aligned with an upper horizontal surface of the sixth post cap liner 338.

The thirteenth dielectric 342 may be formed as described above in regards to the first dielectric 102. The thirteenth dielectric 342 may include the same or different materials of the ninth dielectric 302, the tenth dielectric 310, the eleventh dielectric 336 and the twelfth dielectric 340. The thirteenth dielectric 342 may be formed on the twelfth dielectric 340 and on the sixth post cap liner 338.

A chemical mechanical polishing (CMP) technique may be used to remove excess material and polish upper surfaces of the structure 800, providing a uniform horizontal surface of the thirteenth dielectric 342.

In this embodiment, the metal line 304 has portions removed and boxes 314, 316, 320 removed, providing isolation between devices which are connected to each of the remaining portions of the first metal line 304. Additional cavities may be formed in any of the first set of lower metal lines and the second set of upper metal lines, may be formed in any of the vias of the structure 800 and across one or more of any of the first set of lower metal lines and the second set of upper metal lines, and may be formed in the tenth dielectric 310 and/or the third top cap layer 308.

Figure 38:
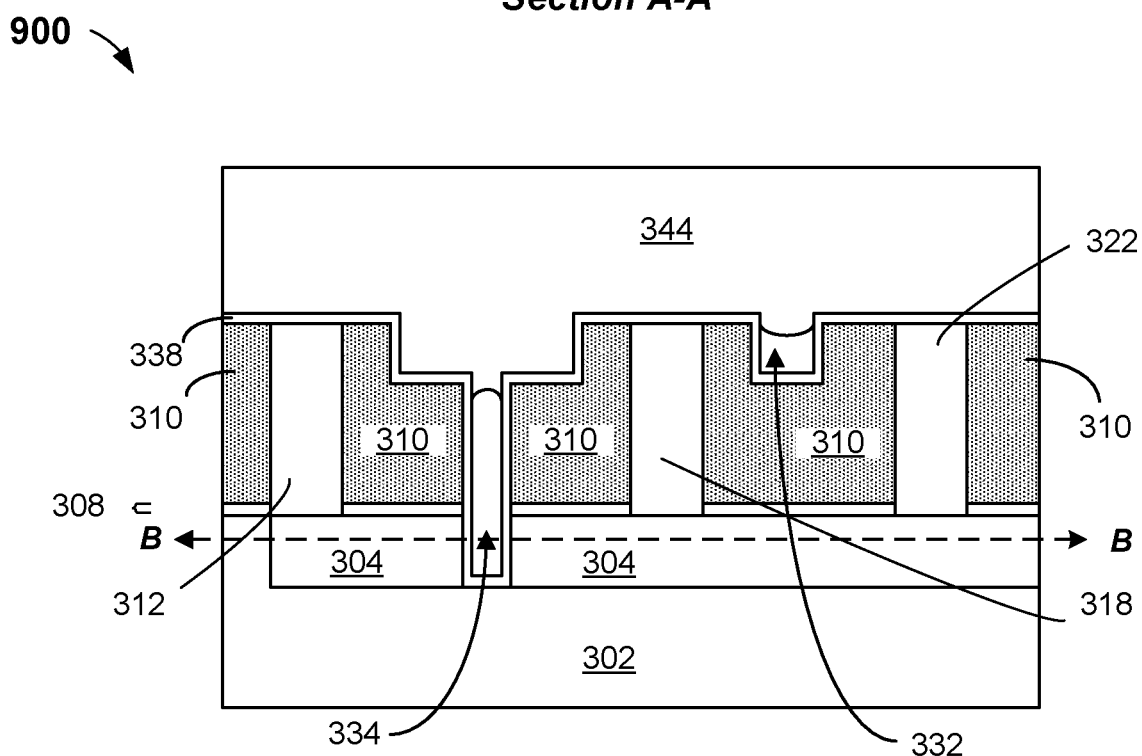
FIG. 38 illustrates a cross sectional side view of formation of an air gap, according to an exemplary embodiment.

Referring now to FIG. 38, a structure 900 is shown according to an exemplary embodiment. The structure 900 is an alternate embodiment formed from subsequent processing of the structure 800 as described above in FIG. 36. FIG. 38 is a cross-sectional side view of the structure 900 along section A-A. As shown in FIG. 38, a fourteenth dielectric 344 may be formed.

The fourteenth dielectric 344 may be formed as described above in regards to the first dielectric 102. The fourteenth dielectric 344 may include the same or different materials of the different materials of the ninth dielectric 302, the tenth dielectric 310, the eleventh dielectric 336, the twelfth dielectric 344 or the thirteenth dielectric 342.

The fourteenth dielectric 344 may partially fill an upper portion of each of the cavities 332, 334. The fourteenth dielectric 344 may provide either a concave lower surface in each of the cavities 332, 334 or a convex lower surface in each of the cavities 332, 334. These two different embodiments may be controlled by deposition conditions.

The resulting structure 900 contains an air gap in each of the cavities 332, 334. Advantages of the air gap in each of the cavities 332, 334, include increased thermal and electrical isolation between devices which are connected to each of the remaining portions of first metal line of the first set of metal line 304.

In this embodiment, the metal line 304 has portions removed and boxes 314, 316, 320 removed, providing isolation between devices which are connected to each of the remaining portions of the first metal line 304. Additional cavities may be formed in any of the first set of lower metal lines and the second set of upper metal lines, may be formed in any vias of the structure 900 and across one or more of any of the first set of lower metal lines and the second set of upper metal lines, and may be formed in the tenth dielectric 310 and/or the third top cap layer 308.

Figure 39:
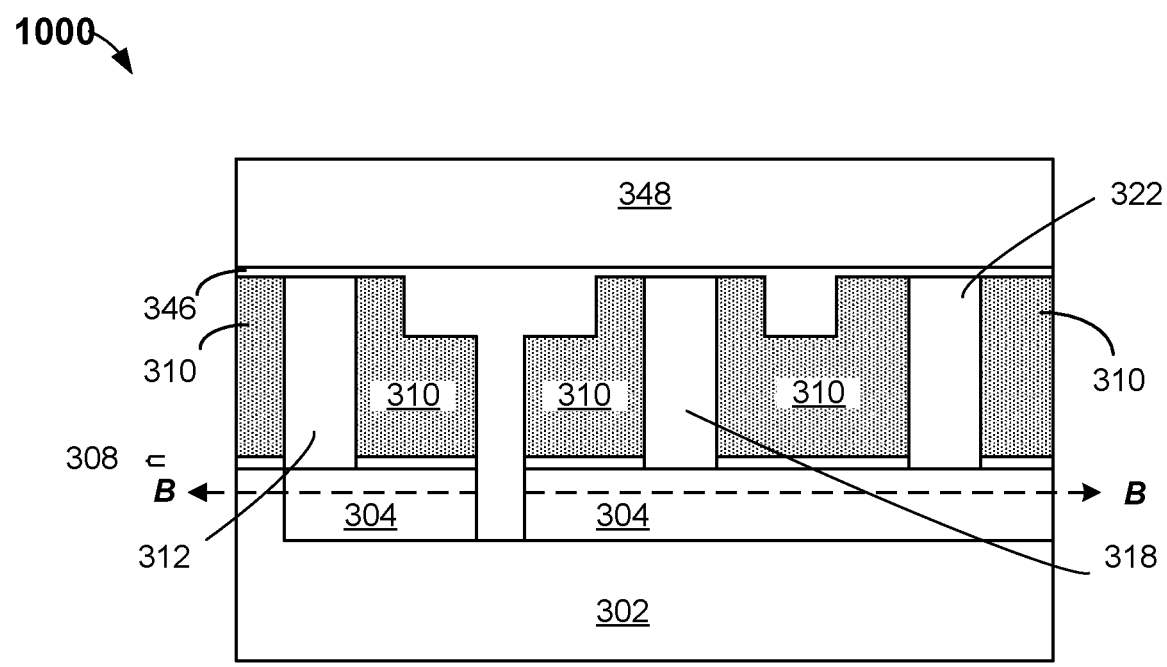
FIG. 39 illustrates a cross sectional side view of formation of a post cap liner and a dielectric, according to an exemplary embodiment.

Referring now to FIG. 39, a structure 1000 is shown according to an exemplary embodiment. The structure 1000 is an alternate embodiment formed from subsequent processing of the structure 700 as described above in FIG. 34. FIG. 39 is a cross-sectional side view of the structure 1000. As shown in FIG. 39, a seventh post cap liner 346 and a fifteenth dielectric 348 may be formed.

The seventh post cap liner 346 may be conformally formed on the structure 1000. The seventh post cap liner 346 may fill the cavities 330, 332, 334. The seventh post cap liner 346 may cover an upper horizontal surface of the tenth dielectric 310 and the vias 312, 318, 322.

The seventh post cap liner 346 may be formed as described above in regards to the first post cap liner 124. The seventh post cap liner 346 may include the same material or a different material than the sixth post liner 338.

A chemical mechanical polishing (CMP) technique may be used to remove excess material and polish upper surfaces of the structure 1000, providing a uniform horizontal surface of the seventh post cap liner 346.

The fifteenth dielectric 348 may be formed as described above in regards to the first dielectric 102. The fifteenth dielectric 348 may include the same or different materials of the ninth dielectric 302, the tenth dielectric 310, the eleventh dielectric 336, the twelfth dielectric 344, the sixteenth dielectric 342, or the seventeenth dielectric 344.

In this embodiment, the first metal line of the first set of metal lines 304 has portions removed and boxes 314, 316, 320, providing isolation between devices which are connected to each of the remaining portions of the metal line 304. Additional cavities may be formed in any of the first set of lower metal lines, the second set of upper metal lines, may be formed in any of the vias of the structure 100, and across one or more of any of the first set of lower metal lines, the second set of upper metal lines, and may be formed in the tenth dielectric 310, the third top cap layer 308 and either the first set of lower metal lines, the second set of upper metal lines.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor structure comprising:
   a first metal line embedded in a first dielectric layer, the first dielectric layer being above electronic components in the semiconductor structure,
   wherein the first metal line includes a first portion and a second portion, the first portion and the second portion being longitudinally aligned along a length direction of the first metal line and separated by a first air gap.

2. The semiconductor structure of claim 1, wherein the first air gap is covered at a top thereof by a second dielectric layer and is surrounded at sides and a bottom thereof by a post cap liner, the post cap liner being materially different from the second dielectric layer.

3. The semiconductor structure of claim 2, wherein the first metal line further includes a third portion that is longitudinally aligned with the first portion and the second portion along the length direction of the first metal line and is separated from the second portion by a second air gap.

4. The semiconductor structure of claim 3, wherein the second air gap is covered at a top thereof by the second dielectric layer and is surrounded at sides and a bottom thereof by the post cap liner.

5. The semiconductor structure of claim 3, wherein the bottom of the first air gap and the bottom of the second air gap are not coplanar and the first air gap and the second air gap have different heights.

6. The semiconductor structure of claim 1, wherein the first metal line has a width that is uniform across the first portion and the second portion, and a length of the first portion is greater than the width of the first metal line.

7. The semiconductor structure of claim 1, further comprising a top cap layer on top of the first portion and the second portion of the first metal line, wherein edges of the top cap layer are vertically aligned with sidewalls of the first portion and the second portion of the first metal line.

8. The semiconductor structure of claim 1, wherein the first air gap has a top surface spanning substantially from the first portion of the first metal line to the second portion of the first metal line, the top surface being in a concave or convex shape.

9. The semiconductor structure of claim 1, further comprising a second metal line embedded in the first dielectric layer, the second metal line being parallel to the first metal line,
   wherein the first air gap separates the second metal line into a fourth portion and a fifth portion, the fourth portion and the fifth portion being longitudinally aligned along a length direction of the second metal line.

10. The semiconductor structure of claim 1, wherein the second portion of the first metal line is vertically above two or more metal lines of another metal level, the two or more metal lines are oriented orthogonally with the first metal line.

11. A semiconductor structure comprising:
    a metal structure embedded in a first dielectric layer, the first dielectric layer being above electronic components in the semiconductor structure,
    wherein the metal structure includes a first portion, a second portion, and a third portion; the first portion, the second portion, and the third portion are longitudinally aligned along a length direction of the metal structure and separated by a second dielectric layer; and a thickness of the second dielectric layer at between the second portion and the third portion of the metal structure is thicker than a thickness of the second dielectric layer at between the first portion and the second portion of the metal structure.

12. The semiconductor structure of claim 11, wherein a portion of the second dielectric layer at between the first portion and the second portion of the metal structure is surrounded at sidewalls and a bottom thereof by a post cap liner, the post cap liner being materially different from the second dielectric layer.

13. The semiconductor structure of claim 11, further comprising a top cap layer directly on top of the first portion, the second portion, and the third portion of the metal structure, the top cap layer being vertically aligned with the first portion, the second portion, and the third portion of the metal structure.

14. The semiconductor structure of claim 11, wherein the metal structure is a trench and via structure having a first set of portions containing only trenches and a second set of portions containing both trenches and vias, with a height of the second set of portions being higher than a height of the first set of portions.

15. A semiconductor structure comprising:
a first metal line and a second metal line embedded in a first dielectric layer; and
a dielectric structure truncating both the first and the second metal lines,
wherein the dielectric structure includes an air gap surrounded at sidewalls and a bottom thereof by a post cap liner and covered at a top thereof by a second dielectric layer.

16. The semiconductor structure of claim 15, wherein the first and the second metal lines are covered by a top cap layer, the top cap being covered by the post cap liner, and the post cap liner is covered by the second dielectric layer.

17. The semiconductor structure of claim 16, wherein the dielectric structure fully insulates a first portion of the first and the second metal lines, to a left side of the dielectric structure, from a second portion of the first and the second metal lines, to a right side of the dielectric structure.

18. The semiconductor structure of claim 15, further comprising a set of metal lines of a lower metal level, the first and the second metal lines being orthogonally oriented with respect to the set of metal lines of the lower metal level.

* * * * *